(12) United States Patent
Alptekin et al.

(10) Patent No.: US 9,190,406 B2
(45) Date of Patent: Nov. 17, 2015

(54) FIN FIELD EFFECT TRANSISTORS HAVING HETEROEPITAXIAL CHANNELS

(71) Applicant: International Business Machines Corporation, Armonk, NY (US)

(72) Inventors: Emre Alptekin, Wappingers Falls, NY (US); Wing L. Lai, Williston, VT (US); Ravikumar Ramachandran, Pleasantville, NY (US); Matthew W. Stoker, Poughkeepsie, NY (US); Henry K. Utomo, Newburgh, NY (US); Reinaldo A. Vega, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/158,987

(22) Filed: Jan. 20, 2014

(65) Prior Publication Data

US 2015/0206876 A1 Jul. 23, 2015

(51) Int. Cl.
*H01L 21/00* (2006.01)
*H01L 29/66* (2006.01)
*H01L 27/088* (2006.01)
*H01L 21/306* (2006.01)
*H01L 21/8234* (2006.01)
*H01L 29/06* (2006.01)

(52) U.S. Cl.
CPC ...... *H01L 27/0886* (2013.01); *H01L 21/30604* (2013.01); *H01L 21/823412* (2013.01); *H01L 21/823431* (2013.01); *H01L 21/823462* (2013.01); *H01L 29/0653* (2013.01); *H01L 29/6681* (2013.01)

(58) Field of Classification Search
CPC ............... H01L 21/30604; H01L 21/823412; H01L 21/823462; H01L 21/823431; H01L 29/0653; H01L 29/6681; H01L 29/66795; H01L 27/0886
USPC .......... 257/192, 368, 204, 288; 438/591, 595, 438/287, 164
See application file for complete search history.

(56) References Cited

U.S. PATENT DOCUMENTS

| 7,525,161 | B2 * | 4/2009 | Ieong et al. ............ 257/369 |
| 7,943,458 | B2 | 5/2011 | Jagannathan et al. |
| 7,993,999 | B2 | 8/2011 | Basker et al. |
| 8,124,483 | B2 | 2/2012 | Schulz |
| 8,138,543 | B2 | 3/2012 | Cheng et al. |
| 8,294,180 | B2 | 10/2012 | Doyle et al. |
| 8,309,447 | B2 | 11/2012 | Cheng et al. |
| 2013/0099313 | A1 | 4/2013 | Cartier et al. |

* cited by examiner

*Primary Examiner* — Nikolay Yushin
(74) *Attorney, Agent, or Firm* — Scully, Scott, Murphy & Presser, P.C.; Joseph P. Abate, Esq.

(57) ABSTRACT

Disposable gate structures are formed over semiconductor material portions, and source and drain regions can be formed in the semiconductor material portions. After formation of a planarization dielectric layer, one type of disposable gate structure can be removed selective to at least another type of disposable gate structure employing a patterned hard dielectric mask layer. After recessing a surface portion of a body portion, a heteroepitaxial channel portion is formed on the remaining physically exposed portion of the body portion by selective epitaxy of a semiconductor material different from the semiconductor material of the remaining body portion. A plurality of types of heteroepitaxial channel portions can be formed in different types of semiconductor devices. Replacement gate structures can be formed in the gate cavities to provide field effect transistors having different threshold voltages.

20 Claims, 19 Drawing Sheets

FIN FIELD EFFECT TRANSISTORS HAVING HETEROEPITAXIAL CHANNELS

BACKGROUND

The present disclosure generally relates to semiconductor devices, and particularly to field effect transistors having a heteroepitaxial channel, and methods of manufacturing the same.

Threshold voltage adjustment on field effect transistors having small channel dimensions is difficult because field effect transistors having small channel dimensions are not only difficult to manufacture with different channel dimensions, but also stochastic effects of dopant distribution are manifested in such field effect transistors. However, a systematic method for controlling threshold voltages is necessary to provide field effect transistors having different types of device characteristics in a same semiconductor chip.

SUMMARY

Disposable gate structures are formed over semiconductor material portions, and source and drain regions can be formed in the semiconductor material portions. After formation of a planarization dielectric layer, one type of disposable gate structure can be removed selective to at least another type of disposable gate structure employing a patterned hard dielectric mask layer. After recessing a surface portion of a body portion, a heteroepitaxial channel portion is formed on the remaining physically exposed portion of the body portion by selective epitaxy of a semiconductor material different from the semiconductor material of the remaining body portion. A plurality of types of heteroepitaxial channel portions can be formed in different types of semiconductor devices. Replacement gate structures can be formed in the gate cavities to provide field effect transistors having different threshold voltages.

According to an aspect of the present disclosure, a method of forming a semiconductor structure is provided. A first semiconductor material portion and a second semiconductor material portion that include a first semiconductor material are provided on a substrate. A first disposable gate structure straddling the first semiconductor material portion and a second disposable gate structure straddling the second semiconductor material are formed. A planarization dielectric layer laterally surrounding the first disposable gate structure and the second disposable gate structure is formed. The first disposable gate structure is removed to form a gate cavity while the second disposable gate structure is not removed. A region of the first semiconductor material portion is physically exposed within the gate cavity. An epitaxial semiconductor material portion including a second semiconductor material is formed directly on a surface of the first semiconductor material within the gate cavity. The second disposable gate structure is removed. Gate structures are formed on the epitaxial semiconductor material portion and the second semiconductor material portion.

According to another aspect of the present disclosure, a semiconductor structure includes a first field effect transistor and a second field effect transistor that are located on a substrate. A first body region of the first field effect transistor includes a body portion including a first semiconductor material, and a channel layer including a second semiconductor material epitaxially aligned to the first semiconductor material and contacting a first gate dielectric and inner sidewalls of a gate spacer that laterally surrounds the first gate dielectric. A second body region of the second field effect transistor includes a portion of the first second semiconductor material in contact with a second gate dielectric.

DETAILED DESCRIPTION

Figure 1:
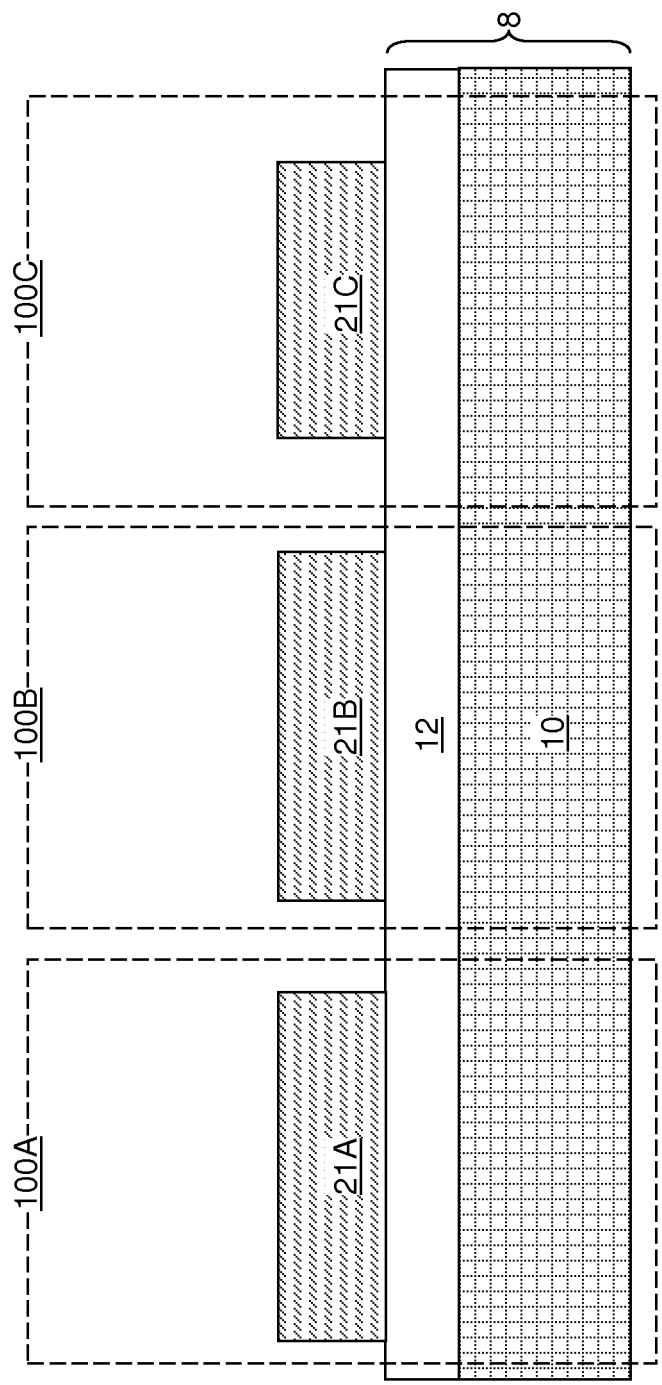
FIG. 1 is a vertical cross-sectional view of a first exemplary semiconductor structure after formation of semiconductor fins according to a first embodiment of the present disclosure.

As stated above, the present disclosure relates to fin field effect transistors having different threshold voltages through gate dielectric stack modification, and methods of manufacturing the same. Aspects of the present disclosure are now described in detail with accompanying figures. Like and corresponding elements are referred to by like reference numerals. Proportions of various elements in the accompanying figures are not drawn to scale. As used herein, ordinals such as "first" and "second" are employed merely to distinguish similar elements, and different ordinals may be employed to designate a same element in the specification and/or claims.

Referring to FIG. 1, a first exemplary semiconductor structure according to a first embodiment of the present disclosure includes a plurality of semiconductor material portions located on a substrate 8. In one embodiment, the plurality of semiconductor material portions can be formed by providing a semiconductor-on-insulator (SOI) substrate including a vertical stack, from bottom to top, of a handle substrate 10, a buried insulator layer 12, and a top semiconductor layer, and by patterning the top semiconductor layer to form the plurality of semiconductor material portions. The top semiconductor layer can include a same semiconductor material throughout, or can include a plurality of regions including different semiconductor materials. Alternatively, a bulk semiconductor substrate can be employed in lieu of an SOI substrate to provide a plurality of semiconductor fins located on a semiconductor substrate, i.e., the remaining portion of the bulk semiconductor substrate excluding the plurality of semiconductor fins.

The first exemplary semiconductor structure can include various device regions. In a non-limiting illustrative example, the first exemplary semiconductor structure can include a first device region 100A, a second device region 100B, and a third device region 100C. Additional device regions (not shown) can be provided for the purpose of forming additional devices. Further, multiple instances of devices can be formed in each of the device regions (100A, 100B, 100C). Each of the device regions (100A, 100B, 100C) includes at least one semiconductor fin. The first device region 100A can be employed to form a first fin field effect transistor, the second device region 100B can be employed to form a second fin field effect transistor, and the third device region 100C can be employed to form a third fin field effect transistor.

At least one first semiconductor material portion can be formed in the first device region 100A, at least one second semiconductor material portion can be formed in the second device region 100B, and at least one third semiconductor material portion can be formed in the third device region 100C. In one embodiment, the at least one first semiconductor material portion can be at least one first semiconductor fin 21A, the at least one second semiconductor material portion can be at least one second semiconductor fin 21B, and the at least one third semiconductor material portion can be at least one third semiconductor fin 21C.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a body portion is located within a semiconductor fin.

In one embodiment, each of the semiconductor fins can have a rectangular horizontal cross-sectional shape bounded by a pair of lengthwise sidewalls and a pair of widthwise sidewalls. As used herein, a "lengthwise direction" of an element refers to a direction about which the moment of inertia of the element becomes a minimum. As used herein, a lengthwise sidewall of an element refers to a sidewall of an element that extends along the lengthwise direction of the element. As used herein, a widthwise sidewall of an element refers to a sidewall of the element that extends along a horizontal direction that is perpendicular to the lengthwise direction of the element.

In one embodiment, each of the device regions (100A, 100B, 100C) can include at least one semiconductor fin (21A, 21B, or 21C). In one embodiment, the entirety of the each semiconductor fin (21A, 21B, 21C) can include a same single crystalline semiconductor material. The semiconductor material for the at least one semiconductor fin (21A, 21B, or 21C) in each device region (100A, 100B, 100C) can be independently selected. In one embodiment, each semiconductor fin (21A, 21B, or 21C) can include a same semiconductor material throughout the entirety of the semiconductor fin (21A, 21B, or 21C). In one embodiment, each semiconductor material for any one of the semiconductor fins (21A, 21B, 21C) can be independently selected from single crystalline silicon, a single crystalline silicon-germanium alloy, a single crystalline silicon-carbon alloy, and a single crystalline silicon-germanium-carbon alloy. In one embodiment, the entirety of the top semiconductor layer can include a same single crystalline semiconductor material, and all of the semiconductor fins (21A, 21B, 21C) can include the same single crystalline semiconductor material.

In one embodiment, each semiconductor fin (21A, 21B, or 21C) can include an intrinsic single crystalline semiconductor material. Alternately, one or more of the semiconductor fins (21A, 21B, 21C) can include a doped semiconductor material. In one embodiment, each of the at least one first semiconductor fin 21A in the first device region 100A can be intrinsic or can have a doping of a first conductivity type, and each of the at least one second semiconductor fin 21B in the second device region 100B can be intrinsic or can have a doping of a second conductivity type, which is the opposite of the first conductivity type. For example, the first conductivity type can be p-type and the second conductivity type can be n-type, or vice versa.

Each semiconductor fin (21A, 21B, or 21C) can include a semiconductor material that is independently selected from silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, each semiconductor fin (21A, 21B, or 21C) can include a semiconductor material that is independently selected from single crystalline silicon, a single crystalline silicon-germanium alloy, a single crystalline silicon-carbon alloy, and a single crystalline silicon-germanium-carbon alloy. As used herein, a "semiconductor material" of an element refers to all elemental or compound semiconductor materials in the element excluding the electrical dopants therein. The semiconductor material within each semiconductor fin can be the same throughout the entirety of the semiconductor fin.

Each semiconductor fin (21A, 21B, 21C) can have a rectangular horizontal cross-sectional area. The width of each semiconductor fin (21A, 21B, 21C) can be in a range from 5 nm to 300 nm, although lesser and greater thicknesses can also be employed. The height of each semiconductor fin (21A, 21B, 21C) can be in a range from 30 nm to 600 nm, although lesser and greater thicknesses can also be employed. In one embodiment, the semiconductor fins (21A, 21B, 21C) can have a same width. In one embodiment, the semiconductor fins (21A, 21B, 21C) can have the same height.

Figure 2:
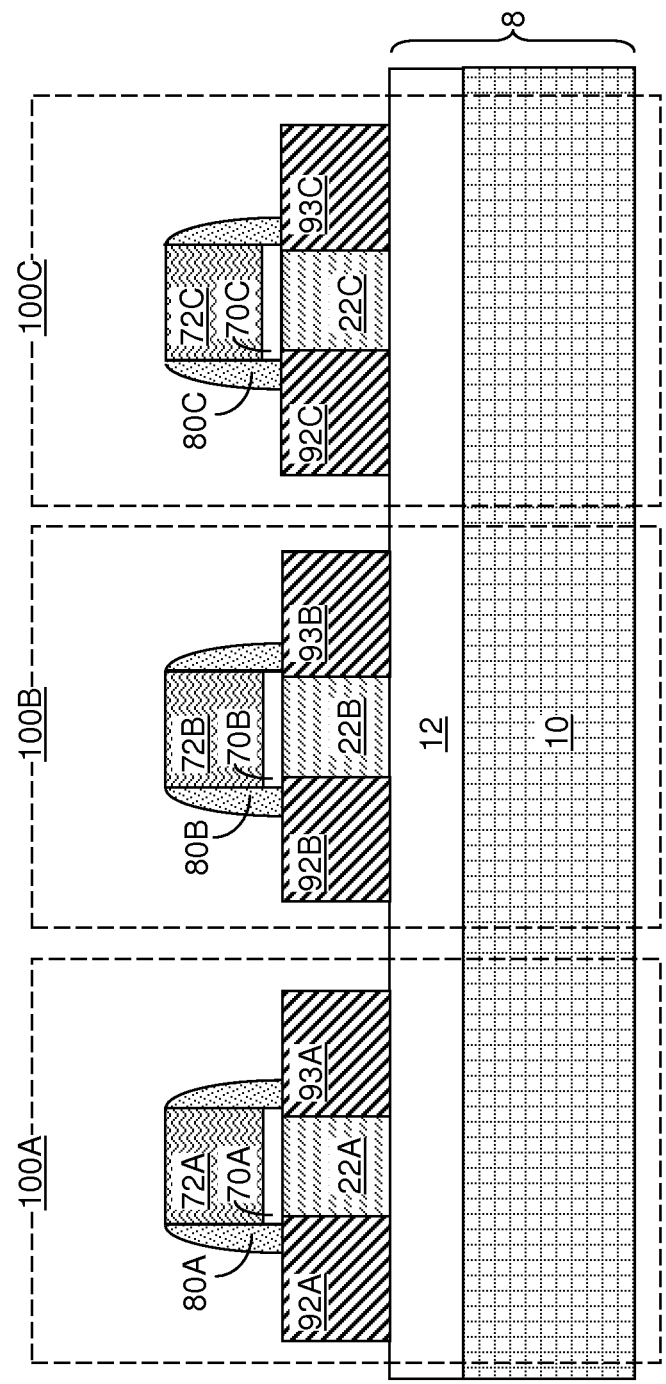
FIG. 2 is a vertical cross-sectional view of a first exemplary semiconductor structure after formation of disposable gate structures, gate spacers, and source and drain regions according to a first embodiment of the present disclosure.
Figure 2A:
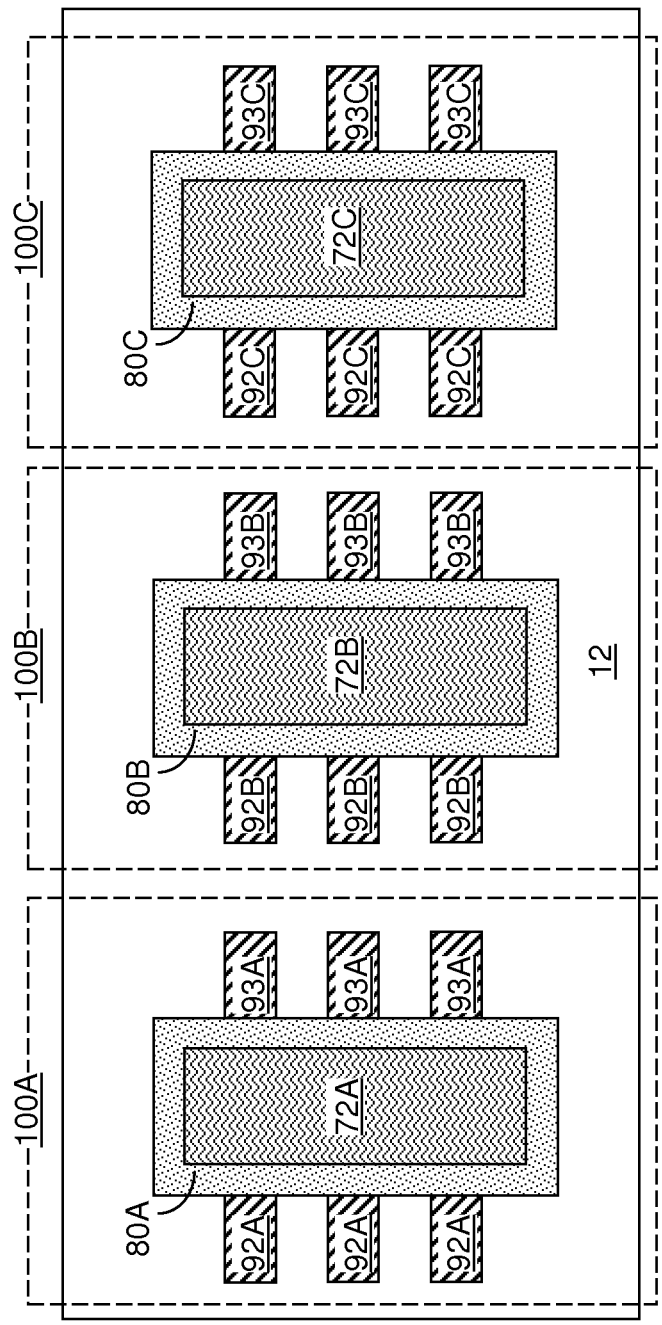
FIG. 2A is a top-down view of the first exemplary semiconductor structure of FIG. 2.

Referring to FIGS. 2 and 2A, a disposable dielectric layer and a disposable gate material layer are deposited and lithographically patterned to form disposable gate structures. In one embodiment, at least one disposable gate structure can be formed in each device region (100A, 100B, 100C). A first disposable gate structure (70A, 72A) straddles the at least one first semiconductor material portion (such as the at least one first semiconductor fin 21A shown in FIG. 1), a second disposable gate structure (70B, 72B) straddles the at least one second semiconductor material portion (such as the at least one second semiconductor fin 21B shown in FIG. 1), and a third disposable gate structure (70C, 72C) straddles the at least one third semiconductor material portion (such as the at least one third semiconductor fin 21C shown in FIG. 1).

Each disposable gate structure can include a vertical stack of a disposable dielectric portion (70A, 70B, or 70C) and a disposable gate material portion (72A, 72B, or 72C). Each disposable dielectric portion (70A, 70B, 70C) is a remaining portion of the disposable dielectric layer after the lithographic patterning, and each disposable gate material portion (72A, 72B, 72C) is a remaining portion of the disposable gate material layer after the lithographic patterning. The disposable dielectric portions (70A, 70B, 70C) can include a dielectric material such as silicon oxide, silicon nitride, and/or silicon oxynitride. The disposable gate material portions (72A, 72B, 72C) can include a conductive material, semiconductor material, and/or a dielectric material that is different from the material of the disposable dielectric portions (70A, 70B, 70C). The conductive material can be an elemental metal or a metallic compound. The semiconductor material can be silicon, germanium, a III-V compound semiconductor material, or an alloy or a stack thereof, and the dielectric material can be silicon oxide, silicon nitride, or porous or non-porous organosilicate glass (OSG).

Dielectric gate spacers (80A, 80B, 80C) can be formed on sidewalls of each of the disposable gate structures (70A, 70B, 70C, 72A, 72B, 72C), for example, by deposition of a conformal dielectric material layer and an anisotropic etch. The dielectric gate spacers (80A, 80B, 80C) can include, for example, a first gate spacer 80A formed in the first device region 100A, a second gate spacer 80B formed in the second device region 100B, and a third gate spacer 80C formed in the third device region 100C.

Electrical dopants of a conductivity type can be implanted into the device regions (100A, 100B, 100C) to form various source and drain regions, which can include, for example, first source regions 92A, first drain regions 93A, second source regions 92B, second drain regions 93B, third source regions 92C, and third drain regions 93C. Each first source region 92A and each first drain region 93A are formed within a first semiconductor fin 21A (See FIG. 1). Each second source region 92B and each second drain region 93B are formed within a second semiconductor fin 21B (See FIG. 1). Each third source region 92C and each third drain region 93C are formed within a third semiconductor fin 21C (See FIG. 1). For a semiconductor fin (21A, 21B, 21C) doped with dopants of a first conductivity type (which is p-type or n-type), the conductivity type of the implanted electrical dopants can be a second conductivity type that is the opposite of the first conductivity type. For example, if the first conductivity type is p-type, the second conductivity type is n-type, and vice versa. If a semiconductor fin (21A, 21B, or 21C) is intrinsic, p-type dopants or n-type dopants can be implanted to form a source region (92A, 92B, or 92C) or a drain region (93A, 93B, or 93C).

The formation of the various source regions and the various drain regions can be performed prior to, and/or after, formation of the various gate spacers (80A, 80B, 80C). The remaining portions of the first, second, and third semiconductor fins (21A, 21B, 21C) constitute at least one first body portion 22A, at least one second body portion 22B, and at least one third body portion 22C, respectively. Each body portion (22A, 22B, 22C) is a sub-portion of a semiconductor material portion that does not include any source region (92A, 92B, 92C) or any drain region (93A, 93B, 93C). As used herein, a "sub-portion" refers to a subset that is less than an entirety of an element. Within each semiconductor fin, the source region (92A, 92B, or 92C), the drain region (93A, 93B, or 93C), and the body portion (22A, 22B, or 22C) can have the same width, i.e., the maximum lateral dimension. It is understood that the maximum lateral dimensions of the source regions (92A, 92B, 92C), the drain regions (93A, 93B, 93C), and the body portions (22A, 22B, 22C) are measured along the widthwise direction of each semiconductor fin, i.e., along a horizontal direction perpendicular to the lengthwise direction of each semiconductor fin.

Optionally, metal semiconductor alloy portions (not shown) can be formed on the physically exposed top surface of the various source regions (92A, 92B, 92C) and the various drain regions (93A, 93B, 93C), for example, by deposition of a metal layer and an anneal that forms a metal semiconductor alloy (such as a metal silicide). Unreacted remaining portions of the metal semiconductor alloy can be removed, for example, by a wet etch.

Figure 3:
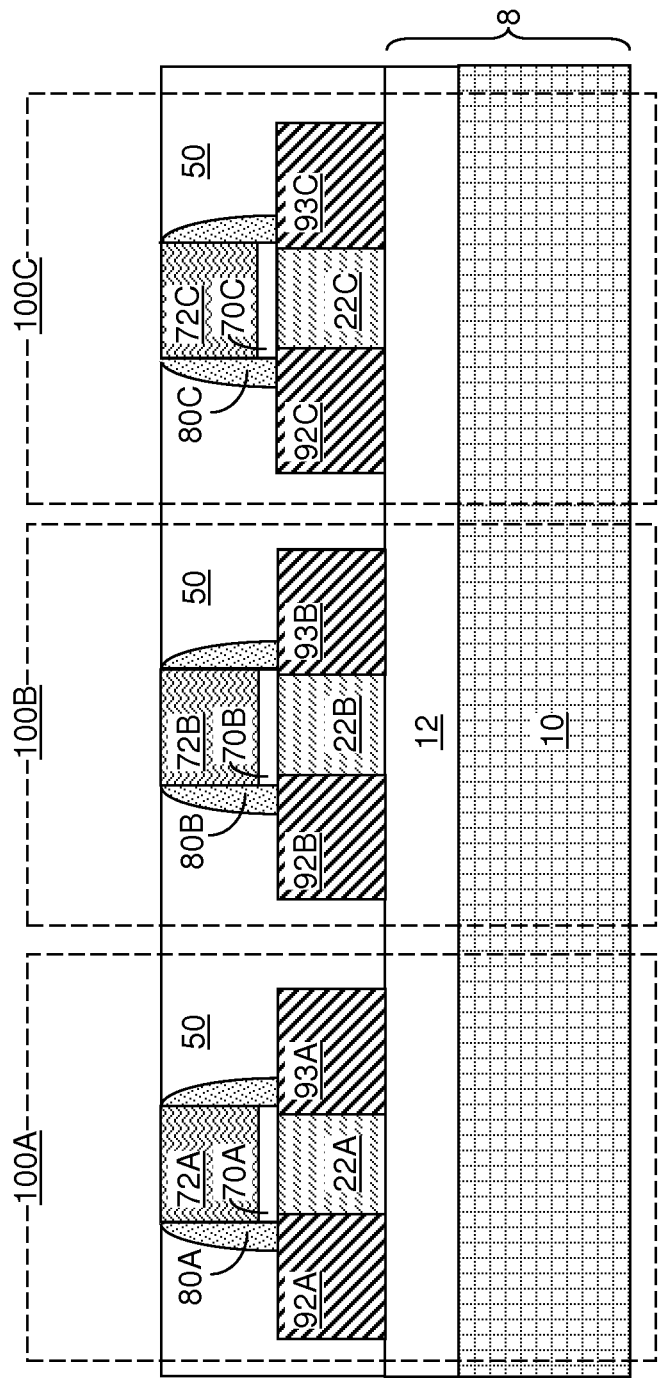
FIG. 3 is a vertical cross-sectional view of the first exemplary semiconductor structure after formation of a planarization dielectric layer according to the first embodiment of the present disclosure.

Referring to FIG. 3, a planarization dielectric layer 50 is deposited over the disposable gate structures (70A, 72A, 70B, 72B, 70C, 72C), the various gate spacers (80A, 80B, 80C), the various source regions (92A, 92B, 92C), and the various drain regions (93A, 93B, 93C). The planarization dielectric layer 50 includes a dielectric material, which can be a self-planarizing dielectric material such as a spin-on glass (SOG), or a non-planarizing dielectric material such as silicon oxide, silicon nitride, organosilicate glass, or combinations thereof.

The planarization dielectric layer 50 is subsequently planarized, for example, by chemical mechanical planarization (CMP) such that top surfaces of the disposable gate structures (70A, 72A, 70B, 72B, 70C, 72C) become physically exposed. In one embodiment, the planarized top surface of the planarization dielectric layer 50 can be coplanar with the top surfaces of the disposable gate structures (70A, 72A, 70B, 72B, 70C, 72C). The planarization dielectric layer 50 laterally surrounds the first disposable gate structure (70A, 72A), the second disposable gate structure (70B, 72B), and the third disposable gate structure (70C, 72C).

Figure 4:
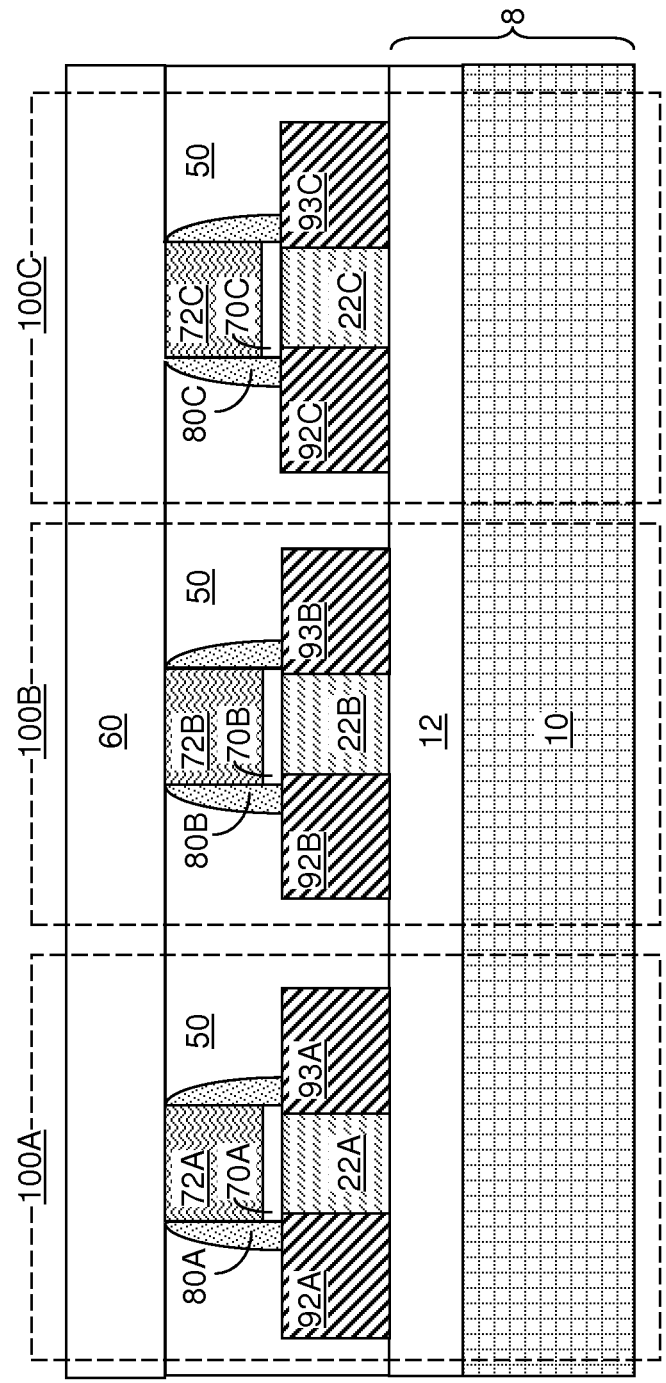
FIG. 4 is a vertical cross-sectional view of the first exemplary semiconductor structure after formation of a dielectric mask layer

Referring to FIG. 4, a dielectric mask layer 60 can be formed over the planarization dielectric layer 50. The dielectric mask layer 60 includes a dielectric material such as silicon oxide, amorphous or diamond-like carbon, or silicon nitride. In one embodiment, the dielectric mask layer 60 includes silicon oxide. The dielectric mask layer 60 can be deposited, for example, by chemical vapor deposition. The thickness of the dielectric mask layer 60 can be in a range from 10 nm to 100 nm, although lesser and greater thicknesses can also be employed.

Figure 5:
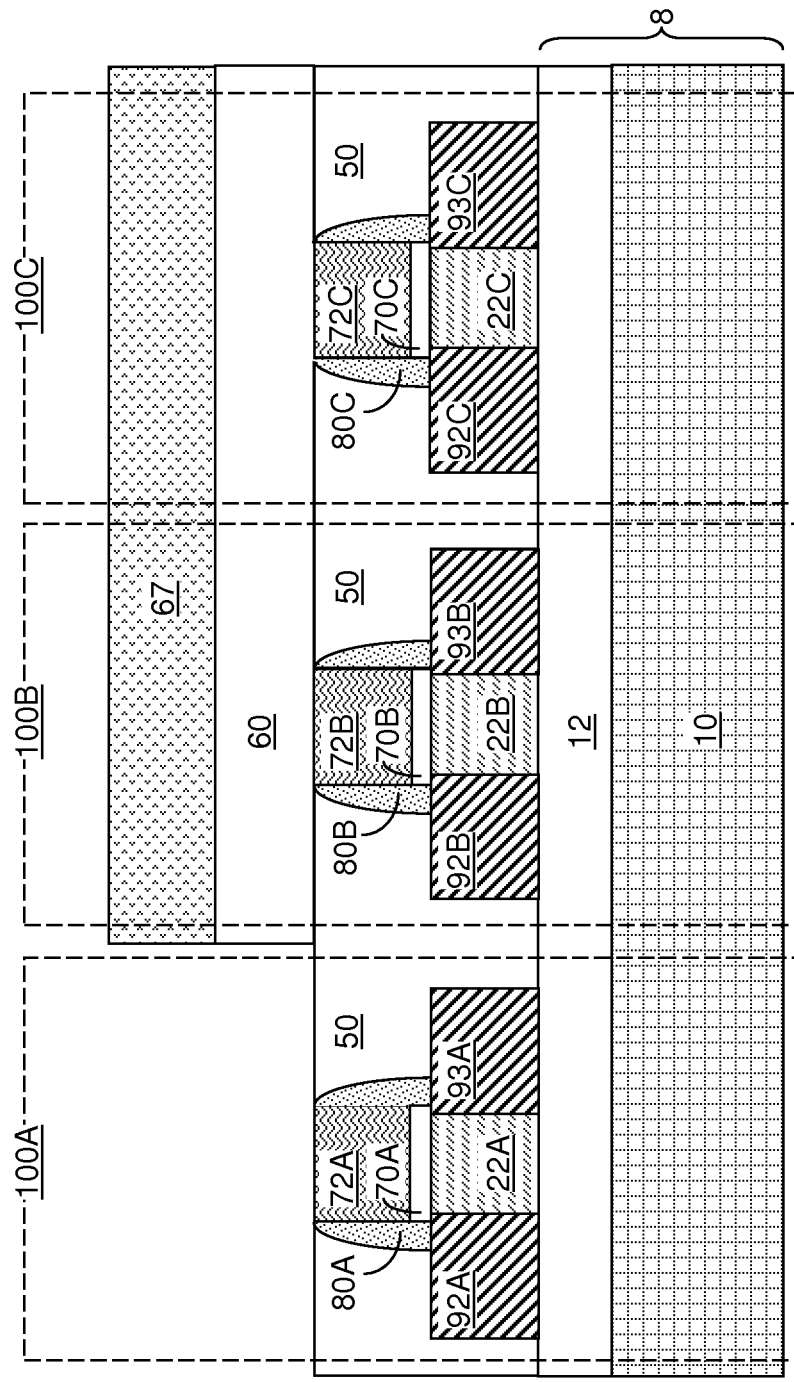
FIG. 5 is a vertical cross-sectional view of the first exemplary semiconductor structure after patterning the dielectric mask layer according to the first embodiment of the present disclosure.

Referring to FIG. 5, a photoresist layer 67 is applied over the dielectric mask layer 60, and is lithographically patterned to cover the second device region 100B and the third device region 100C, while exposing the top surface of the dielectric mask layer 60 within the first device region 100A. The pattern in the photoresist layer 67 is transferred into the dielectric mask layer 60 by an etch, which can be an anisotropic etch or an isotropic etch. An opening in the dielectric mask layer 60 is formed over the first disposable gate structure (70A, 72A), while the second disposable gate structures (70B, 72B, 70C, 72C) are masked by a remaining portion of the dielectric mask layer 60.

Figure 6:
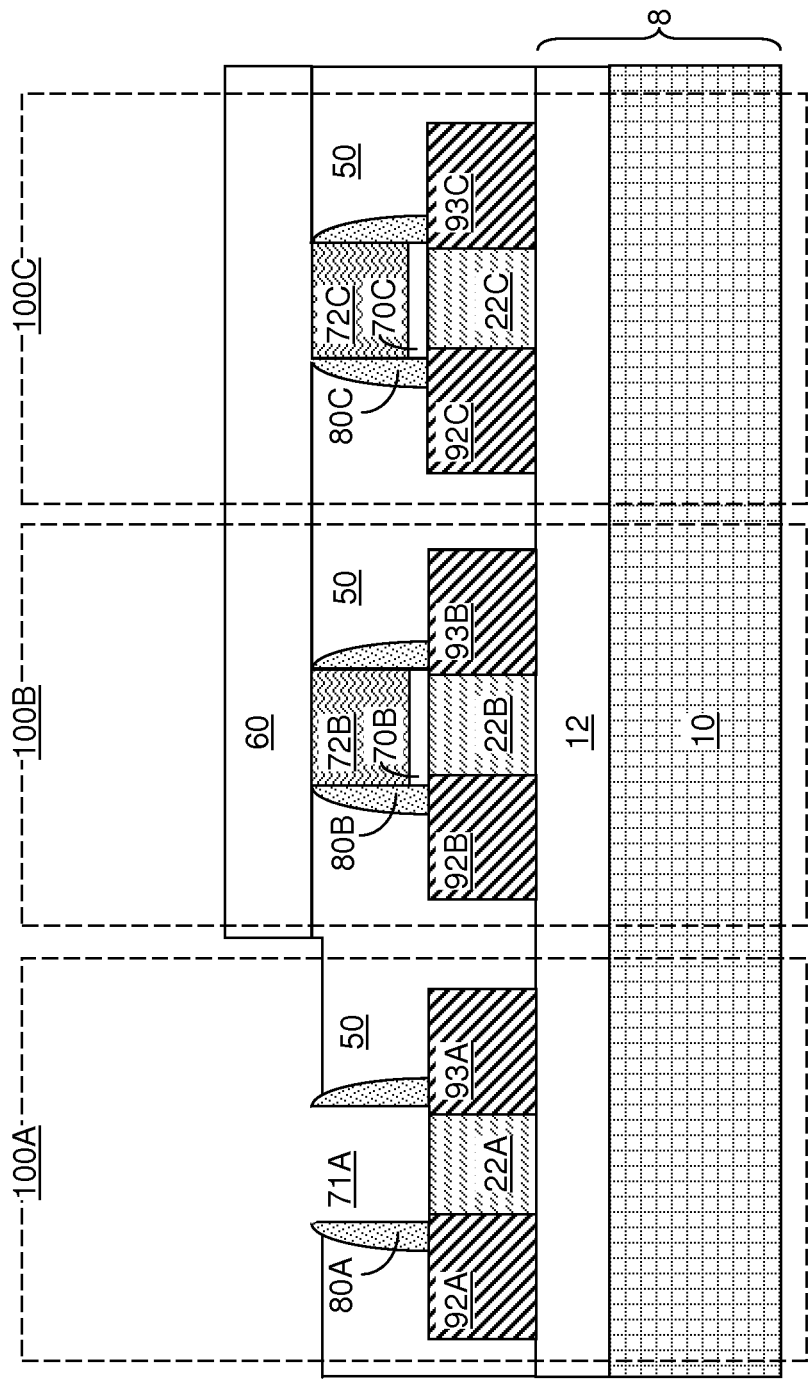
FIG. 6 is a vertical cross-sectional view of the first exemplary semiconductor structure after removal of a first disposable gate structure and formation of a first gate cavity according to the first embodiment of the present disclosure.

Referring to FIG. 6, the first disposable gate structure (70A, 72A) is removed from underneath the opening in the dielectric mask layer 60 to form a first gate cavity 71A, while the second and third disposable gate structures (70B, 72B, 70C, 72C) are not removed. In one embodiment, the first disposable gate structure (70A, 72A) can be removed selective to the planarization dielectric layer 50 and the first gate spacers 80A, while the dielectric mask layer 60 prevents removal of underlying materials within the second and third device regions (100B, 100C).

The removal of the first disposable gate structure (70A, 72A) can be performed, for example, by an isotropic etch such as a wet etch, or by an anisotropic etch such as a reactive ion etch. The first gate cavity 71A is formed in the space from which the first disposable gate structure (70A, 72A) is removed. A region (i.e., a sub-portion) of each first semiconductor material portion is physically exposed within the first gate cavity 71A. In one embodiment, the physically exposed region of the first semiconductor portion can be at least one first body portion 22A of the at least one first semiconductor fin (92A, 93A, 22A). Additionally, peripheral portions of the at least one first source region 92A and peripheral portions of the at least one first drain region 92B can be physically exposed within the first gate cavity 71A. In one embodiment, the physically exposed portion of the top surface of the planarization dielectric layer 50 may be vertically recessed due to a collateral etch that occurs during the removal of the first disposable dielectric portion 70A.

In one embodiment, the first disposable dielectric portion 70A and the buried insulator layer 12 can include silicon oxide. In this case, physically exposed portions of the buried insulator layer 12 can be vertically recessed during the removal of the first disposable dielectric portion 70A due to a collateral etching that occurs during the etching of the first disposable dielectric portion 70A.

Figure 7:
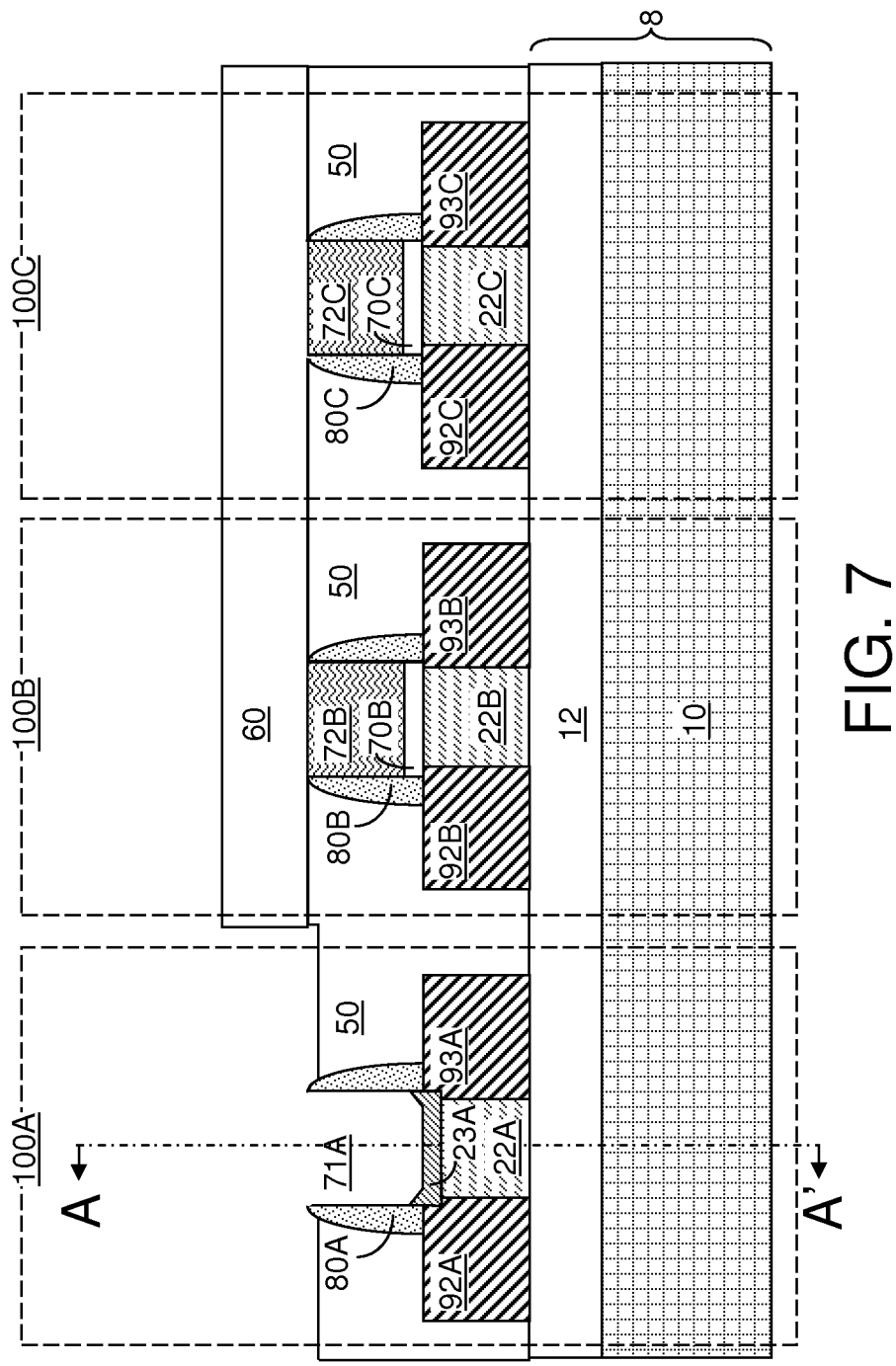
FIG. 7 is a vertical cross-sectional view of the first exemplary semiconductor structure after a first selective heteroepitaxy of a second semiconductor material on a surface of a first semiconductor material within the first gate cavity according to the first embodiment of the present disclosure.
Figure 7A:
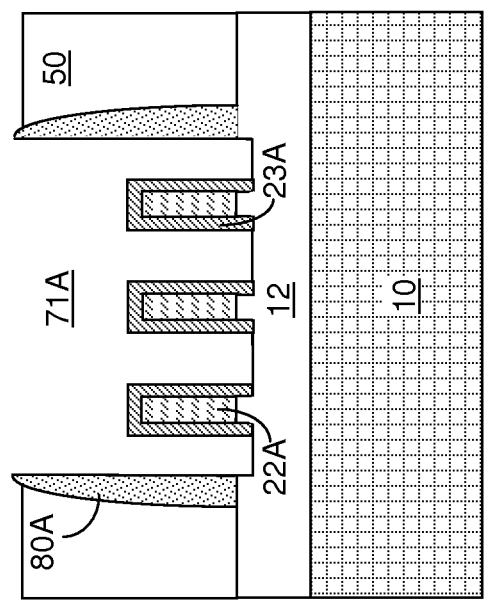
FIG. 7A is a vertical cross-sectional view of the first exemplary semiconductor structure of FIG. 7 along the vertical plane A-A' in FIG. 7.

Referring to FIGS. 7 and 7A, optionally, physically exposed portions of each first semiconductor material portion may be recessed, laterally or vertically, within the first gate cavity 71A. If the at least one first semiconductor material portion is at least one first semiconductor fin (92A, 93A, 22A), all physically exposed surfaces of the first body portion 22A of each first semiconductor fin (92A, 93A, 22A) are etched isotropically during the recessing. In addition, a portion of each first source region 92A and a portion of each first drain region 93A can be etched during the recessing of the first semiconductor material portion. In this case, the recessed surfaces of each first semiconductor material portion include a vertically recessed top surface of a first body portion 22A and laterally recessed sidewalls of the first body portion 22A. Further, the recessed surfaces of each first semiconductor material portion can further include vertically recessed top surfaces of a first source region 92A and a first drain region 93A, and laterally recessed sidewall of the first source region 92A and the first drain region 93A. The depth of recess with respect to the topmost surfaces of the at least one first source region 92A and the at least one first drain region 93A can be in a range from 0.3 nm to 5 nm, although lesser and greater recess depths can also be employed.

In one embodiment, an anisotropic etch can be employed to recess the first semiconductor material employing the first gate spacer 80A and the planarization dielectric layer 50 as an etch mask. In this case, physically exposed vertical surfaces of the at least one first source region 92A and the at least one first drain region 93A can be vertically coincident with inner sidewalls of the first gate spacer 80A. As used herein, a first surface is "vertically coincident" with a second surface if there exists a vertical plane that includes the first surface and the second surface.

In one embodiment, an isotropic etch can be performed to recess the first semiconductor material employing the first gate spacer 80A and the planarization dielectric layer 50 as an etch mask. In this case, physically exposed surfaces of the at least one body portion 22A, the at least one first source region 92A, and the at least one first drain region 93A can be isotropically recessed by a same recess distance. Because each body portion 22A is recessed laterally from both sides and from the top side, but not from the bottom side, the difference between the width of the unrecessed portions of the at least one first source region 92A and the at least one first drain region 93A and the width of each first body portion 22A can be twice the difference between the height of the unrecessed portions of the at least one first source region 92A and the at least one first drain region 93A and the height of the body portion 22A as recessed.

A selective epitaxy process is performed on the physically exposed surfaces of each first semiconductor fin (92A, 93A, 22A). In one embodiment, the first, second, and third semiconductor fins (92A, 93A, 22A; 92B, 93B, 22B; 92C, 93C, 22C) can include a same single crystalline semiconductor material, which is herein referred to as a first semiconductor material. The first semiconductor material can be single crystalline silicon, a single crystalline silicon germanium alloy, a single crystalline silicon carbon alloy, a single crystalline silicon germanium carbon alloy, or a single crystalline compound semiconductor material. In one embodiment, the first semiconductor material can be single crystalline silicon.

The selective epitaxy process deposits a single crystalline semiconductor material that is different in semiconductor composition from the first semiconductor material. As used herein, the "semiconductor composition" of semiconductor material refers to the component of the composition of the semiconductor material that excludes electrical dopants, which can be p-type dopants such as B, Ga, or As and/or n-type dopants such as P, As, or Sb. The single crystalline semiconductor material that is deposited by the selective epitaxy process is herein referred to as a second semiconductor material. In one embodiment, the first semiconductor material can be single crystalline silicon, and the second semiconductor material can be a single crystalline silicon germanium alloy, a single crystalline silicon carbon alloy, or a single crystalline silicon germanium carbon alloy. In one embodiment, the second semiconductor material has a different band gap width than the first semiconductor material.

Because the second semiconductor material is different from the first semiconductor material, the selective epitaxy process is a selective heteroepitaxy process, i.e., a selective epitaxy process that deposits a material different from the underlying material to a surface of the underlying material. During the selective epitaxy process, at least one semiconductor precursor gas and an etchant gas are flowed simultaneously or alternately into a processing chamber including the first exemplary semiconductor structure. The second semiconductor material is deposited only on single crystalline surfaces such as the physically exposed surfaces of the at least one first semiconductor fin (92A, 93A, 22A), and is not deposited on amorphous surfaces such as the surfaces of the dielectric mask layer 60, the planarization dielectric layer 50, and the first gate spacer 80A. Process conditions for performing selective epitaxy of semiconductor materials are known in the art.

The second semiconductor material is deposited directly on the surfaces of the first semiconductor material within the first gate cavity 71A to form at least one epitaxial semiconductor material portion, which is herein referred to as at least one first channel layer 23A. Each first channel layer 23A is epitaxially aligned to an underlying first body portion 22A. Each first channel layer 23A includes a sub-portion having a uniform thickness throughout, which can be in a range from 1 nm to 5 nm, although lesser and greater thicknesses can also be employed. The top surface of each uniform-thickness sub-portion of the at least one channel layer 23A can be located above, at, or below, the horizontal plane including the topmost surfaces of the at least one first source region 92A and the at least one first drain region 93A.

The second semiconductor material grows from all physically exposed surfaces of the first semiconductor material including physically exposed surfaces of the at least one first source region 92A and the at least one first drain region 93A. In one embodiment, each first channel layer 23A grow from the vertical sidewall surfaces of the at least one first source region 92A and the at least one first drain region 93A, and can contact lower portions of inner sidewalls of the first gate spacer 80A. In one embodiment, faceted surfaces may be formed in peripheral portions of each first channel layer 23A that contact the first gate spacer 80A. In one embodiment, the interfaces between the first channel layer 23A and the at least one first source region 92A or the at least one first drain region 93A can be vertically coincident with sidewalls of the first gate spacer 80A.

Figure 8:
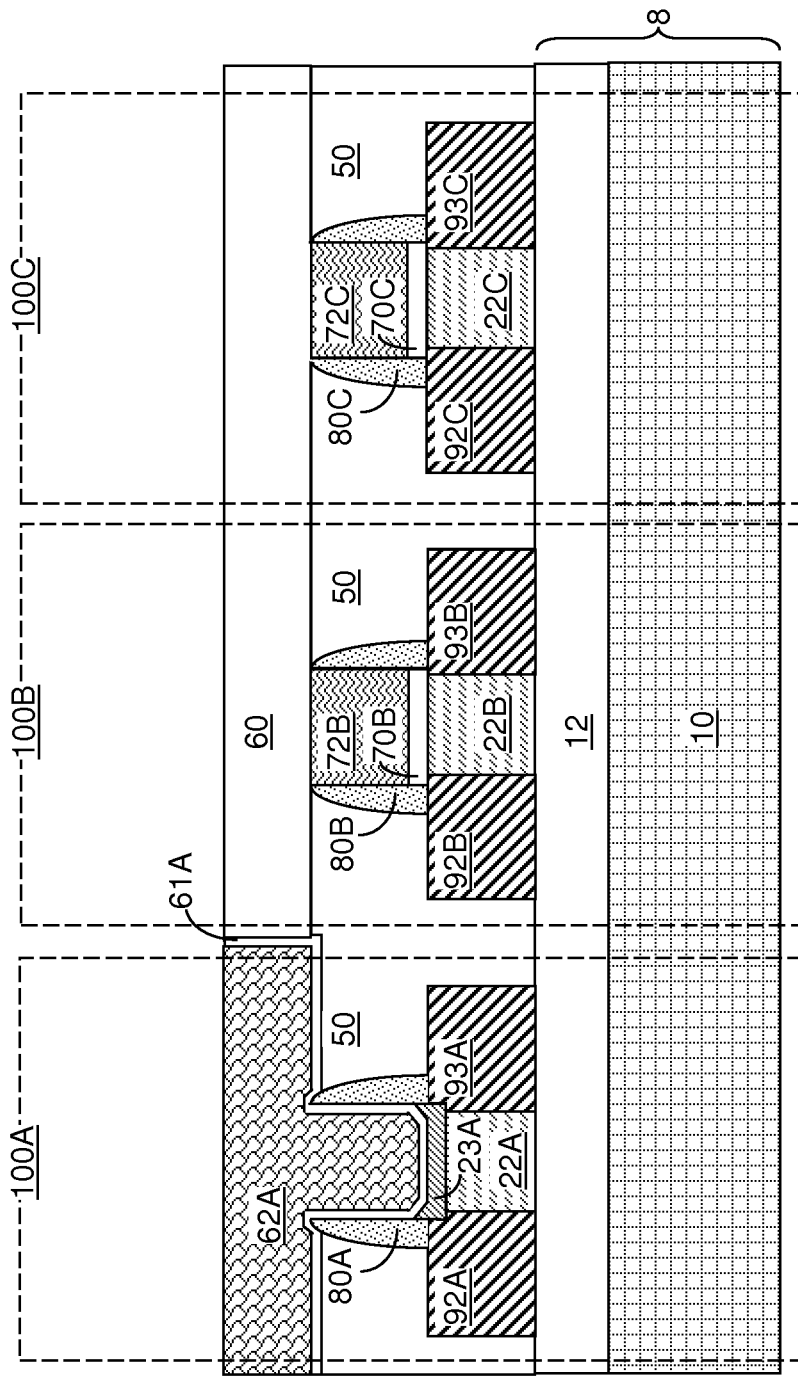
FIG. 8 is a vertical cross-sectional view of the first exemplary semiconductor structure after formation of a first disposable oxide liner and a first fill material portion according to the first embodiment of the present disclosure.

Referring to FIG. 8, a first disposable oxide liner 61A and a first fill material portion 62A can be formed in, and above, the first gate cavity 71A (See FIG. 7), while the second and third disposable gate structures (70B, 72B, 70C, 72C) are present over the substrate 8. The first disposable oxide liner 61A and the first fill material portion 62A can be formed, for example, by depositing a stack of a dielectric oxide layer and a fill material layer in the first gate cavity 71A and over the planarization dielectric layer 40 and the dielectric mask layer 60, and removing portions of the dielectric oxide layer and the fill material layer from above the top surface of the dielectric mask layer 60 employing a planarization process such as chemical mechanical planarization (CMP). The first disposable oxide liner 61A can include silicon oxide or organosilicate glass. The first fill material portion 62A includes a material that can be removed selective to the dielectric mask layer 60, and can include a semiconductor material such as an amorphous semiconductor material or a polycrystalline semiconductor material.

Figure 9:
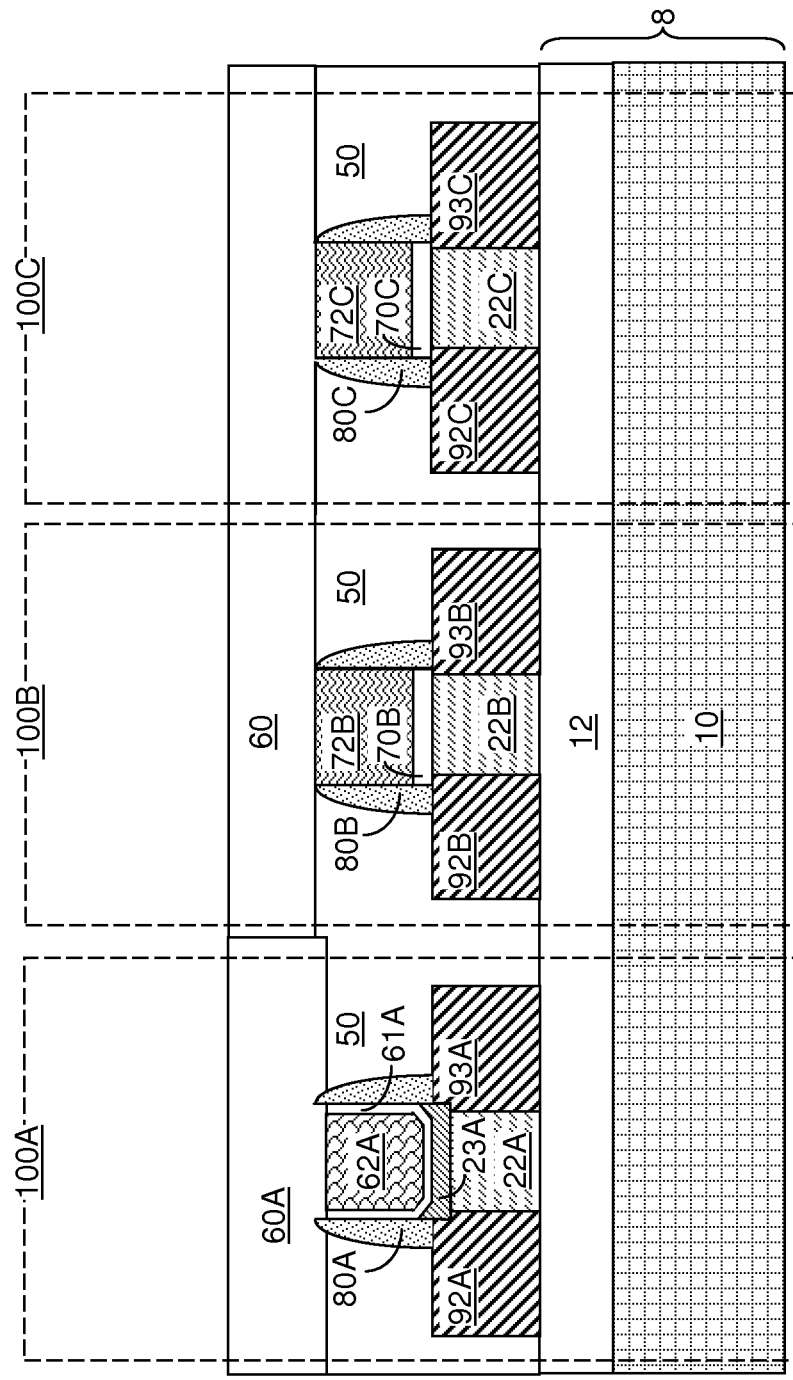
FIG. 9 is a vertical cross-sectional view of the first exemplary semiconductor structure after replacement of an upper portion of the first fill material portion with a first dielectric material portion according to the first embodiment of the present disclosure.

Referring to FIG. 9, an upper portion of the first fill material portion 62A and an upper portion of the first disposable oxide liner 61A are replaced with a dielectric material portion, which is herein referred to as a first dielectric material portion 60A. Specifically, an upper portion of the first fill material portion 62A can be etched selective to the dielectric mask layer 60 by an etch, which can be a wet etch or a dry etch. For example, if the first fill material portion 62A includes a semiconductor material, an etch process that removes the semiconductor material selective to the dielectric mask layer 60 can be employed to remove a sub-portion of the first fill material portion 62A from above the top surface of the planarization dielectric layer 50 in the first device region 100A. Subsequently, an isotropic etch such as a wet etch can be employed to remove a portion of the first disposable oxide liner 61A from above the top surface of the planarization dielectric layer 50 in the first device region 100A.

The dielectric material of the first dielectric material portion 60A can be doped silicon oxide, undoped silicon oxide, amorphous or diamond-like carbon, or silicon nitride. In one embodiment, the dielectric material of the first dielectric material portion 60A can be silicon oxide. The dielectric material of the first dielectric material portion 60A may be the same as, or may be different from, the dielectric material of the dielectric mask layer 60. The dielectric material of the first dielectric material portion 60A can be deposited, for example, by chemical vapor deposition. Excess portions of the deposited dielectric material can be removed from above the top surface of the dielectric mask layer 60, for example, by chemical mechanical planarization.

Figure 10:
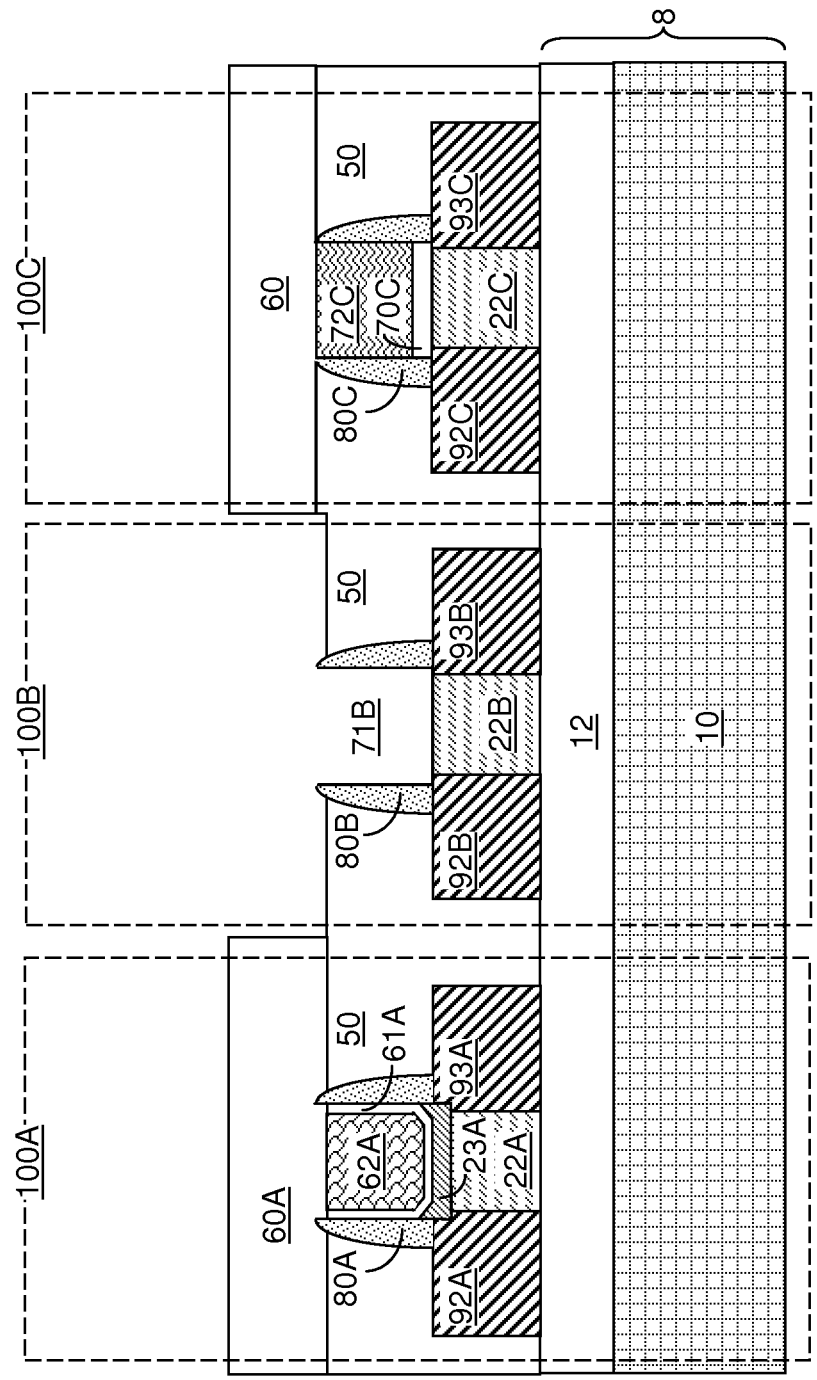
FIG. 10 is a vertical cross-sectional view of the first exemplary semiconductor structure after patterning the dielectric mask layer and removal of a second disposable gate material portion and a second disposable dielectric material portion, and formation of a second gate cavity according to the first embodiment of the present disclosure.

Referring to FIG. 10, the processing steps of FIG. 5 are performed again with the modification that the opening in a photoresist layer is formed within the second device region 100A. Subsequently, the processing steps of FIG. 6 are performed again with the modification that an opening in the dielectric mask layer 60 is formed within the second device region 100B, and the second disposable gate structure (70B, 72B) is removed in lieu of the first disposable gate structure (See FIGS. 5 and 6). A second gate cavity 72B is formed in the space from which the second disposable gate structure (70B, 72B) is removed.

Figure 11:
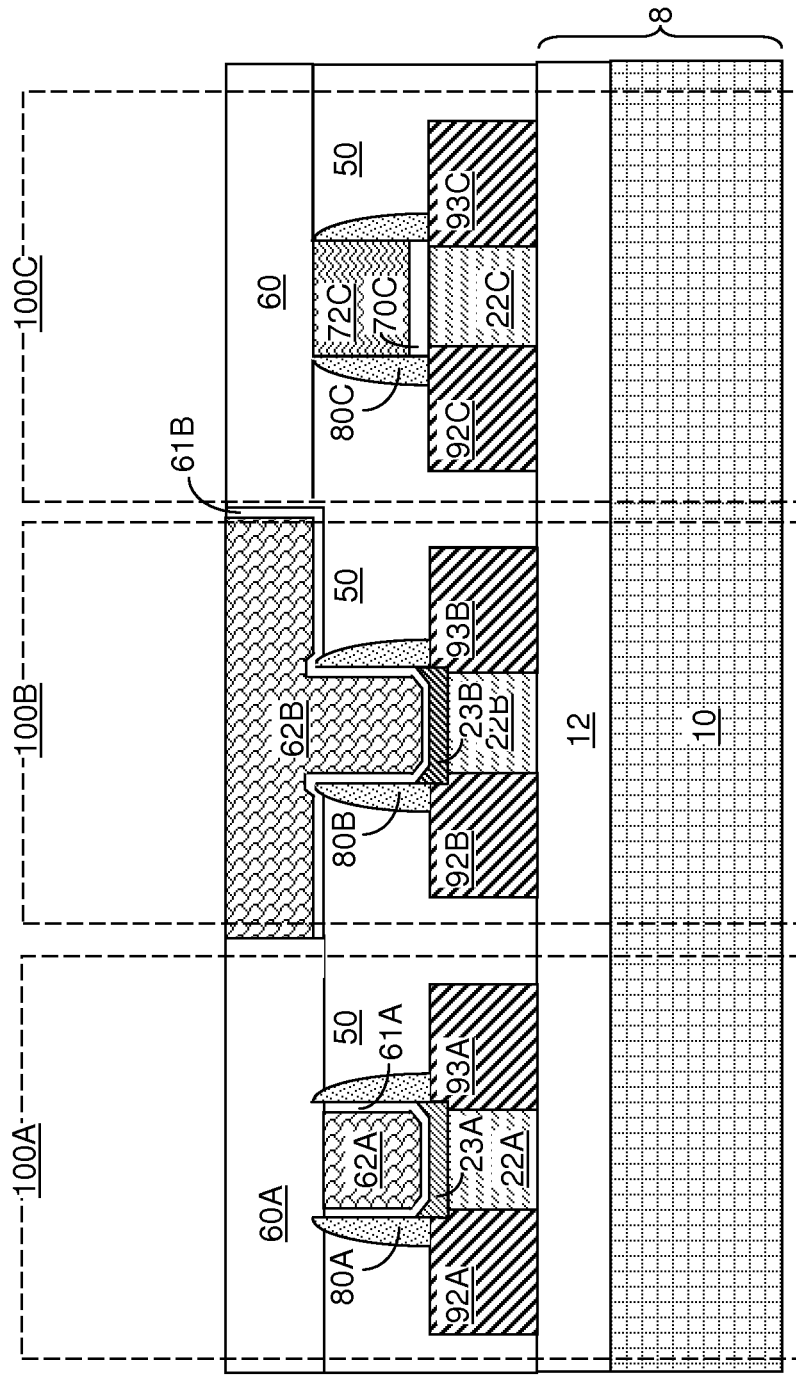
FIG. 11 is a vertical cross-sectional view of the first exemplary semiconductor structure after a second selective heteroepitaxy of a third semiconductor material on a surface of the first semiconductor material within the second gate cavity and formation of a second disposable oxide liner and a second fill material portion according to the first embodiment of the present disclosure.

Referring to FIG. 11, optionally, physically exposed portions of each first semiconductor material portion may be recessed, laterally or vertically, within the second gate cavity 71B. If the at least one first semiconductor material portion is at least one second semiconductor fin (92B, 93B, 22B), all physically exposed surfaces of the second body portion 22B of each second semiconductor fin (92B, 93B, 22B) are etched isotropically during the recessing. In addition, a portion of each second source region 92B and a portion of each second drain region 93B can be etched during the recessing of the first semiconductor material portion. In this case, the recessed surfaces of each first semiconductor material portion include a vertically recessed top surface of a second body portion 22B and laterally recessed sidewalls of the second body portion 22B. Further, the recessed surfaces of each first semiconductor material portion can further include vertically recessed top surfaces of a second source region 92B and a second drain region 93B, and laterally recessed sidewall of the second source region 92B and the second drain region 93B. The depth of recess with respect to the topmost surfaces of the at least one second source region 92B and the at least one second drain region 93B can be in a range from 0.3 nm to 5 nm, although lesser and greater recess depths can also be employed.

In one embodiment, an anisotropic etch can be employed to recess the first semiconductor material employing the second gate spacer 80A and the planarization dielectric layer 50 as an etch mask. In this case, physically exposed vertical surfaces of the at least one second source region 92B and the at least one second drain region 93B can be vertically coincident with inner sidewalls of the second gate spacer 80A.

A selective epitaxy process is performed on the physically exposed surfaces of each second semiconductor fin (92B, 93B, 22B). If the at least one second semiconductor fin (92B, 93B, 22B) includes the first semiconductor material, the selective epitaxy process can deposit a single crystalline semiconductor material that is different in semiconductor composition from the first semiconductor material and the second semiconductor material. The single crystalline semiconductor material that is deposited by the selective epitaxy process is herein referred to as a third semiconductor material. In an illustrative example, the first semiconductor material can be single crystalline silicon, the second semiconductor material can be one of a single crystalline silicon germanium alloy and a single crystalline silicon carbon alloy, and the third semiconductor material can be the other of the single crystalline silicon germanium alloy and the single crystalline silicon carbon alloy. In one embodiment, each of the first, second, and third semiconductor materials can have a different band gap width.

Because the third semiconductor material is different from the first semiconductor material, the selective epitaxy process is a selective heteroepitaxy process. During the selective epitaxy process, at least one semiconductor precursor gas and an etchant gas are flowed simultaneously or alternately into a processing chamber including the second exemplary semiconductor structure. The third semiconductor material is deposited only on single crystalline surfaces such as the physically exposed surfaces of the at least one second semiconductor fin (92B, 93B, 22B), and is not deposited on amorphous surfaces such as the surfaces of the dielectric mask layer 60, the planarization dielectric layer 50, and the second gate spacer 80B, and the first dielectric material portion 60A.

The third semiconductor material is deposited directly on the surfaces of the first semiconductor material within the second gate cavity 71B to form at least one epitaxial semiconductor material portion, which is herein referred to as at least one second channel layer 23B. Each second channel layer 23B is epitaxially aligned to an underlying second body portion 22B. Each second channel layer 23B includes a sub-portion having a uniform thickness throughout, which can be in a range from 1 nm to 5 nm, although lesser and greater thicknesses can also be employed. The top surface of each uniform-thickness sub-portion of the at least one channel layer 23B can be located above, at, or below, the horizontal plane including the topmost surfaces of the at least one second source region 92B and the at least one second drain region 93B.

The third semiconductor material grows from all physically exposed surfaces of the first semiconductor material including physically exposed surfaces of the at least one second source region 92B and the at least one second drain region 93B. In one embodiment, each second channel layer 23B grow from the vertical sidewall surfaces of the at least one second source region 92B and the at least one second drain region 93B, and can contact lower portions of inner sidewalls of the second gate spacer 80B. In one embodiment, faceted surfaces may be formed in peripheral portions of each second channel layer 23B that contact the second gate spacer 80B. In one embodiment, the interfaces between the second channel layer 23B and the at least one second source region 92B or the at least one second drain region 93B can be vertically coincident with sidewalls of the second gate spacer 80B.

A second disposable oxide liner 61B and a second fill material portion 62B can be formed in, and above, the second gate cavity 71B (See FIG. 10), while the third disposable gate structure (70C, 72C) is present over the substrate 8. The second disposable oxide liner 61B and the second fill material portion 62B can be formed, for example, by depositing a stack of a dielectric oxide layer and a fill material layer in the second gate cavity 71B and over the planarization dielectric layer 40, the dielectric mask layer 60, and the first dielectric material portion 60A, and subsequently removing portions of the dielectric oxide layer and the fill material layer from above the top surfaces of the dielectric mask layer 60 and the first dielectric material portion 60A employing a planarization process such as chemical mechanical planarization (CMP). The second disposable oxide liner 61B can include silicon oxide or organosilicate glass. The second fill material portion 62B includes a material that can be removed selective to the dielectric mask layer 60, and can include a semiconductor material such as an amorphous semiconductor material or a polycrystalline semiconductor material.

Figure 12:
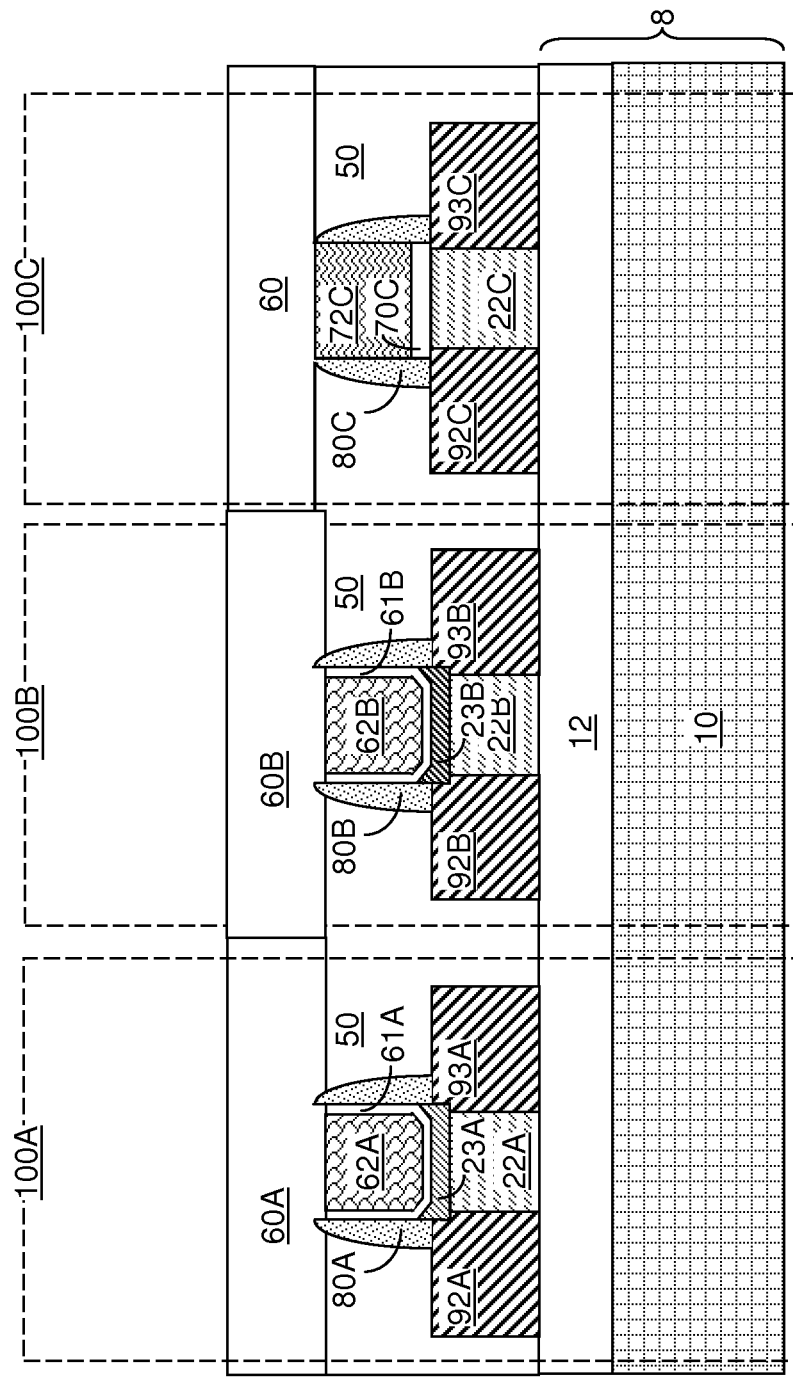
FIG. 12 is a vertical cross-sectional view of the first exemplary semiconductor structure after replacement of an upper portion of the second fill material portion with a second dielectric material portion according to the first embodiment of the present disclosure.

Referring to FIG. 12, an upper portion of the second fill material portion 62B and an upper portion of the second disposable oxide liner 61B are replaced with a dielectric material portion, which is herein referred to as a second dielectric material portion 60B. Specifically, an upper portion of the second fill material portion 62B can be etched selective to the dielectric mask layer 60 and the first dielectric material portion 60A by an etch, which can be a wet etch or a dry etch. For example, if the second fill material portion 62B includes a semiconductor material, an etch process that removes the semiconductor material selective to the dielectric mask layer 60 can be employed to remove a sub-portion of the second fill material portion 62B from above the top surface of the planarization dielectric layer 50 in the second device region 100B. Subsequently, an isotropic etch such as a wet etch can be employed to remove a portion of the second disposable oxide liner 61B from above the top surface of the planarization dielectric layer 50 in the second device region 100B.

The dielectric material of the second dielectric material portion 60B can be doped silicon oxide, undoped silicon oxide, amorphous or diamond-like carbon, or silicon nitride. In one embodiment, the dielectric material of the second dielectric material portion 60B can be silicon oxide. The dielectric material of the second dielectric material portion 60B may be the same as, or may be different from, the dielectric material of the dielectric mask layer 60 and/or the dielectric material of the first dielectric material portion 60A. The dielectric material of the second dielectric material portion 60B can be deposited, for example, by chemical vapor deposition. Excess portions of the deposited dielectric material can be removed from above the top surface of the dielectric mask layer 60, for example, by chemical mechanical planarization.

Figure 13:
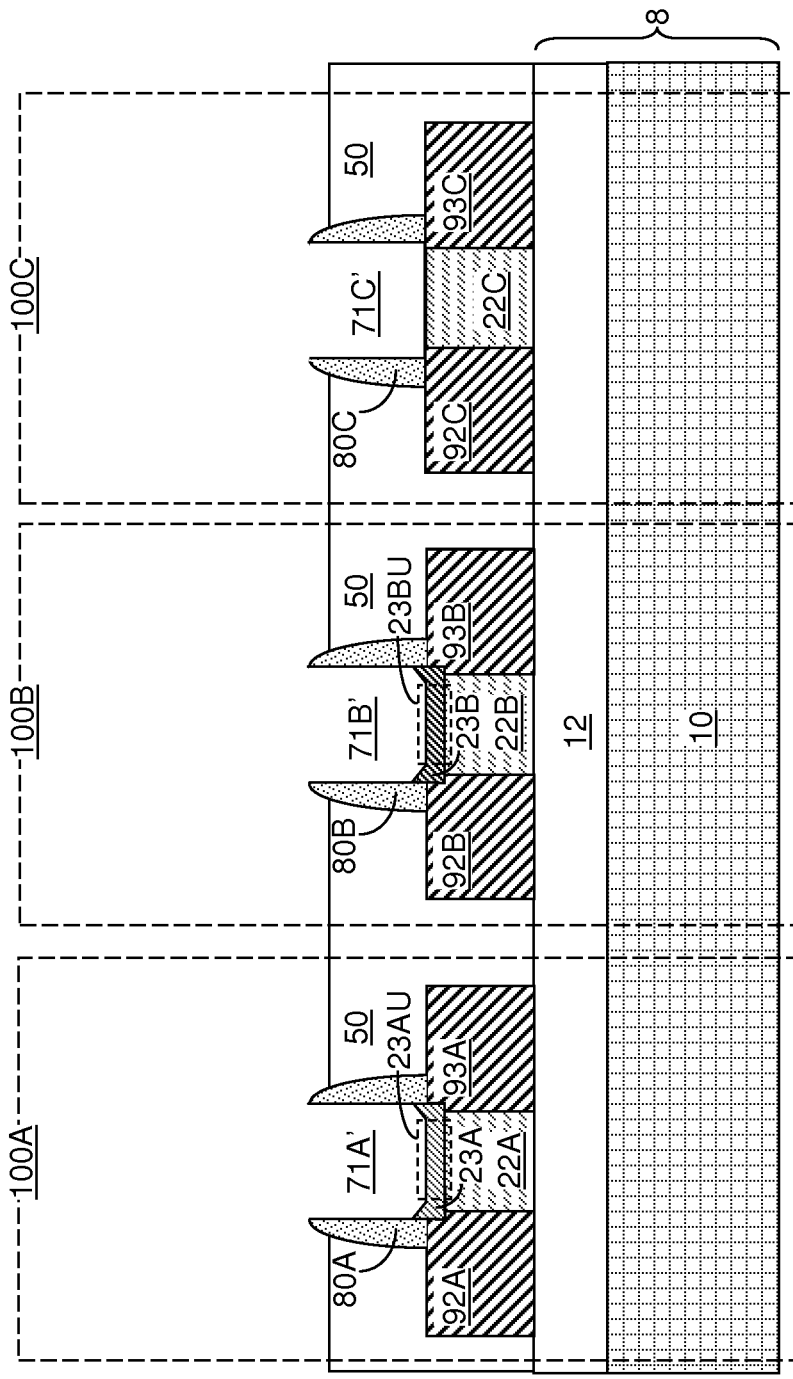
FIG. 13 is a vertical cross-sectional view of the first exemplary semiconductor structure after removal of the dielectric mask layer, the first and second dielectric material portions, remaining portions of the first and second fill material portions, and the first and second disposable oxide liners according to the first embodiment of the present disclosure.
Figure 14:
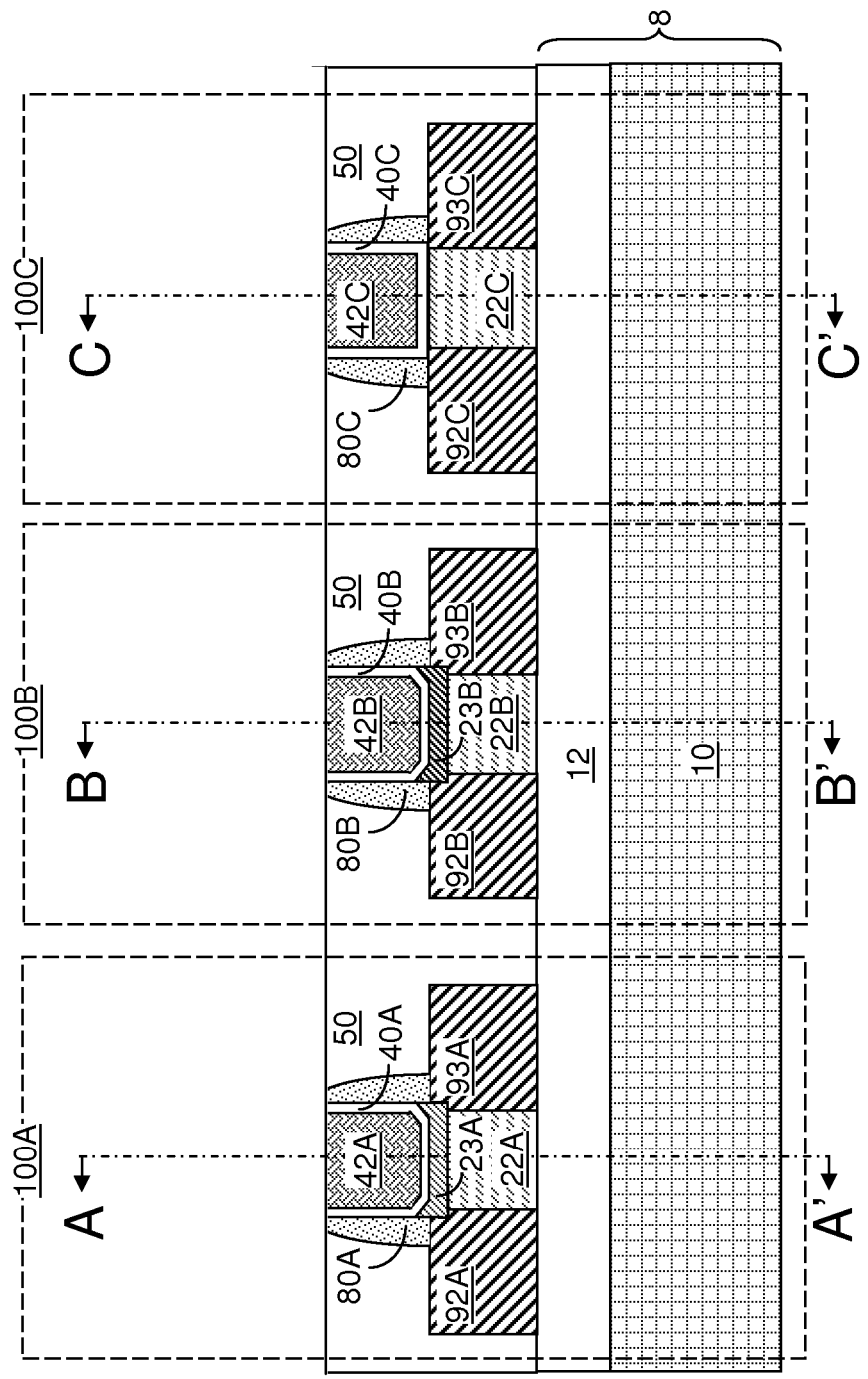
FIG. 14 is a vertical cross-sectional view of the first exemplary semiconductor structure after formation of replacement gate structures according to the first embodiment of the present disclosure.
Figure 14A:
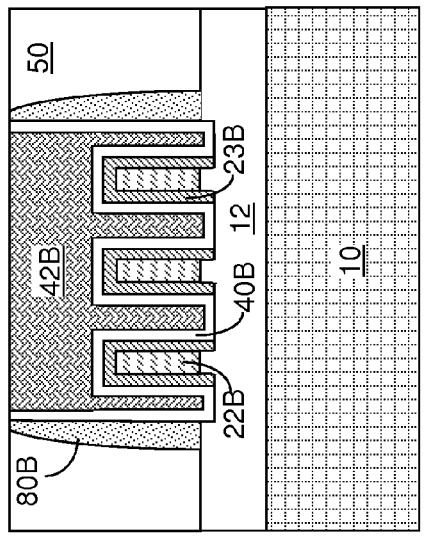
FIG. 14A is a vertical cross-sectional view of the first exemplary structure along the vertical plane A-A' of FIG. 14.
Figure 14B:
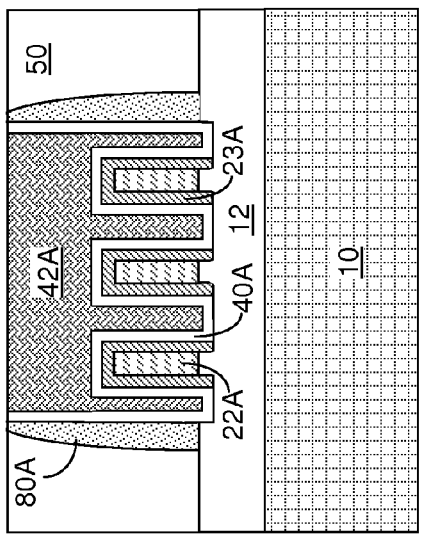
FIG. 14B is a vertical cross-sectional view of the first exemplary structure along the vertical plane B-B' of FIG. 14.
Figure 14C:
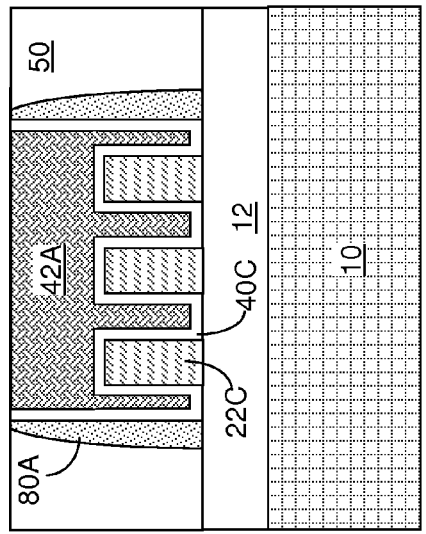
FIG. 14C is a vertical cross-sectional view of the first exemplary structure along the vertical plane C-C' of FIG. 14.
Figure 15:
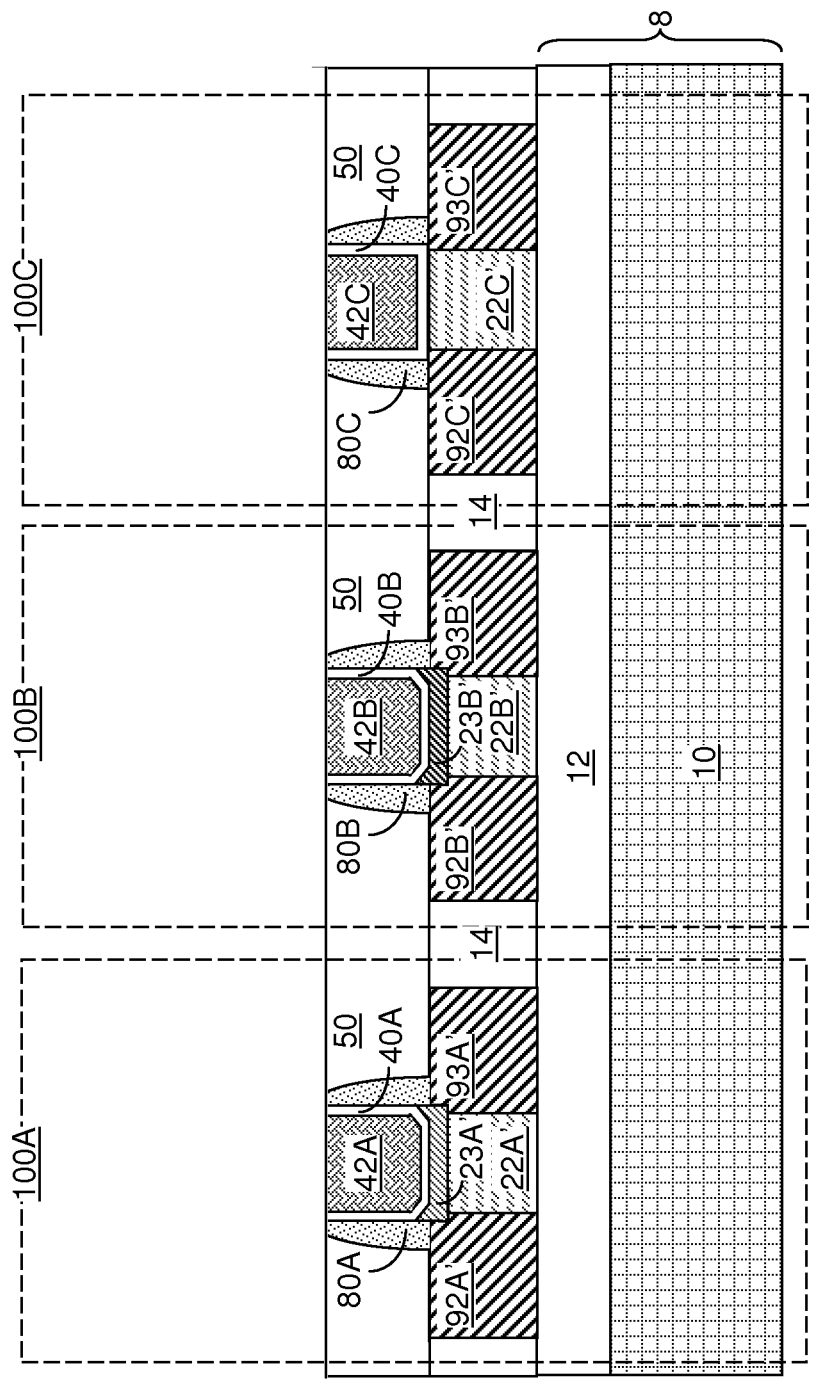
FIG. 15 is a vertical cross-sectional view of a second exemplary semiconductor structure according to a second embodiment of the present disclosure.
Figure 15A:
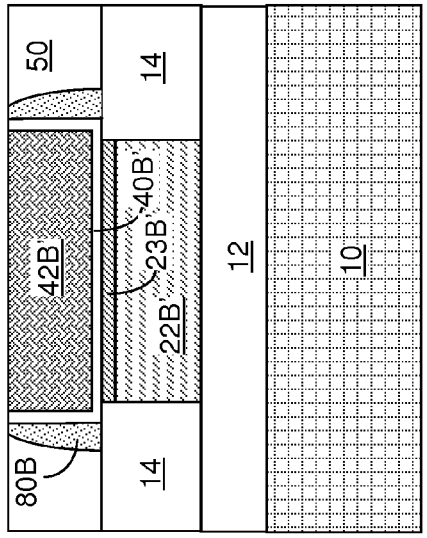
FIG. 15A is a vertical cross-sectional view of the second exemplary structure along the vertical plane A-A' of FIG. 15.
Figure 15B:
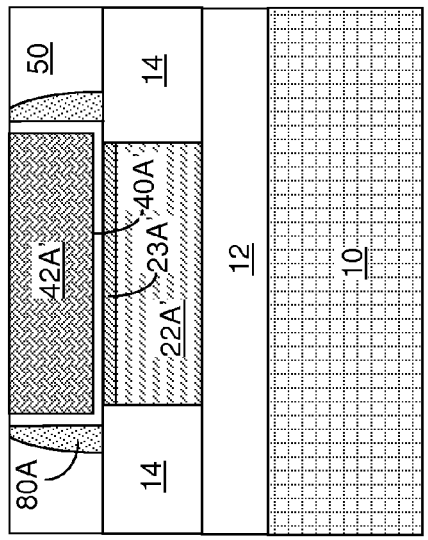
FIG. 15B is a vertical cross-sectional view of the second exemplary structure along the vertical plane B-B' of FIG. 15.
Figure 15C:
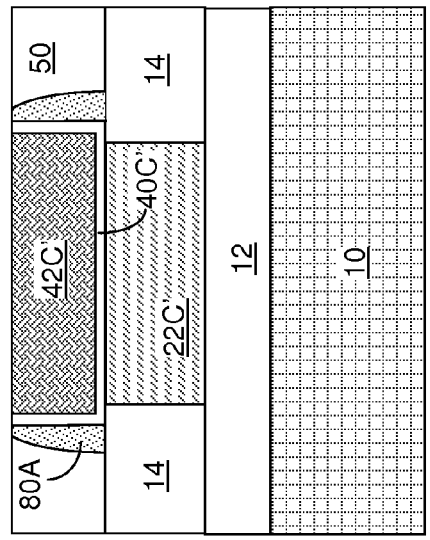
FIG. 15C is a vertical cross-sectional view of the second exemplary structure along the vertical plane C-C' of FIG. 15.

Referring to FIG. 13, the dielectric mask layer 60, the first dielectric material portion 60A, and the second dielectric material portion 60B can be removed from above the planarization dielectric layer 50. The first fill material portion 62A, the second fill material portion 62B, and second disposable gate material portion 72B can be removed selective to the planarization dielectric layer 50 by a wet etch or a dry etch. Subsequently, the first disposable oxide liner 61A, the second disposable oxide liner 61B, and the third disposable dielectric portion 70C can be removed, for example, by an isotropic etch. The isotropic etch can be, for example, a wet etch employing hydrofluoric acid.

A first gate cavity 71A' is formed in a space from which the first fill material portion 62A and the first disposable oxide liner 61A is removed. A second gate cavity 71B' is formed in a space from which the second fill material portion 62B and the second disposable oxide liner 61B is removed. A third gate cavity 71C' is formed in a space from which the third fill material portion 62A and the third disposable oxide liner 61C is removed.

Referring to FIGS. 14, 14A, 14B, and 14C, replacement gate structures are formed by filling the gate cavities (71A", 71B", 71C"; See FIG. 13) with a gate dielectric layer and a gate conductor layer, and removing excess portion of the gate dielectric layer and the gate conductor layer from above the top surface of the planarization dielectric layer 50, for example, by chemical mechanical planarization (CMP). A protruding portion of the gate spacers (80A, 80B, 80C) can be removed during the planarization process. The remaining portion of the gate dielectric layer filling the first gate cavity 71A" is a first gate dielectric 40A, the remaining portion of the gate dielectric layer filling the second gate cavity 71B" is a second gate dielectric 40B, and the remaining portion of the gate dielectric layer filling the third gate cavity 71C" is a third gate dielectric 40C. The remaining portion of the gate conductor layer filling the first gate cavity 71A" is a first gate electrode 42A, the remaining portion of the gate conductor layer filling the second gate cavity 71B" is a second gate electrode 42B, and the remaining portion of the gate conductor layer filling the third gate cavity 71C" is a third gate electrode 42C.

Each of the replacement gate structures (40A, 42A, 40B, 42B, 40C, 42C) is a functional gate structure. As used herein, a "functional gate structure" refers to a stack of a gate electrode and a gate dielectric that can induce turning on and turning off of an electrical current within a field effect transistor.

A first field effect transistor is formed in the first device region 100A, a second field effect transistor is formed in the second device region 100B, and a third field effect transistor is formed in the third device region 100C. The first channel layer 23A and the first body portion 22A collectively constitute the body region of the first field effect transistor, which is herein referred to as the first body region. The second channel layer 23B and the second body portion 22B collectively constitute a body region of the second field effect transistor, which is herein referred to as a second body region (22B, 23B). The third body portion 22C is the body region of the third field effect transistor.

The first body region (22A, 23A) of the first field effect transistor includes the first body portion 22A containing the first semiconductor material and the first channel layer 23A containing the second semiconductor material. The second semiconductor material of the first channel layer 23A is epitaxially aligned to the first semiconductor material of the first body portion 22A, and contacts the first gate dielectric 40A and inner sidewalls of the first gate spacer 80A that laterally surrounds the first gate dielectric 40A.

The second body region (22B, 23B) of the second field effect transistor includes the second body portion 22B containing the second semiconductor material and the second channel layer 23B containing the second semiconductor material. The second semiconductor material of the second channel layer 23B is epitaxially aligned to the second semiconductor material of the second body portion 22B, and contacts the second gate dielectric 40B and inner sidewalls of the second gate spacer 80B that laterally surrounds the second gate dielectric 40B.

The body region of the third field effect transistor is the third body portion 22C, which includes a portion of the first second semiconductor material in contact with the third gate dielectric 40C. In one embodiment, all inner sidewalls of the third gate spacer 80C can be in physical contact with surfaces of the third gate dielectric 80C.

The first channel region 23A includes a sub-portion 23AU having a uniform thickness. The second channel region 23B includes a sub-portion 23BU having a uniform thickness.

In one embodiment, sidewalls of the first channel region 23A can be vertically coincident with inner sidewalls of the first gate spacer 80A, and sidewalls of the second channel region 23B can be vertically coincident with inner sidewalls of the second gate spacer 80B.

An insulator layer, such as the buried insulator layer 12, is located in the substrate 8, and contacts the first gate dielectric 40A, the second gate dielectric 40B, and the third gate dielectric 40C. An interface between the first gate dielectric 40A and the buried insulator layer 12 and an interface between the second gate dielectric 40B and the buried insulator layer 12 are vertically recessed relative to an interface between the third gate dielectric 40C and the buried insulator layer 12.

Each first body portion 22A is a portion of a contiguous semiconductor material portion (92A, 93A, 22A) that includes a first source region 92A and a first drain region 93A and includes the first semiconductor material. The contiguous semiconductor material portion can be a semiconductor fin, and the first body portion 22A has a lesser width than the first source region 92A and the first drain region 93A. Each second body portion 22B is a portion of a contiguous semiconductor material portion (92B, 93B, 22B) that includes a second source region 92B and a second drain region 93B and includes the second semiconductor material. The contiguous semiconductor material portion can be a semiconductor fin, and the second body portion 22B has a lesser width than the second source region 92B and the second drain region 93B.

In one embodiment, the difference between the width of the unrecessed portions of the at least one first source region 92A and the at least one first drain region 93A and the width of each first body portion 22A can be twice the difference between the height of the unrecessed portions of the at least one first source region 92A and the at least one first drain region 93A and the height of the body portion 22A as recessed. In another embodiment, the difference between the width of the unrecessed portions of the at least one second source region 92B and the at least one second drain region 93B and the width of each second body portion 22B can be twice the difference between the height of the unrecessed portions of the at least one second source region 92B and the at least one second drain region 93B and the height of the body portion 22B as recessed.

It is understood that only one, or only two, or all three of the first, second, and third fin field effect transistors may be formed in various embodiments of the present disclosure. Further, it is understood that the labeling of the various field effect transistors as "first," "second," and "third" field effect transistors and the labeling of the various elements of each field effect transistor can be changed arbitrarily, and different ordinals may be assigned to various elements of the exemplary structures of the present disclosure to distinguish similar elements.

Referring to FIGS. 15, 15A, 15B, and 15C, a second exemplary semiconductor structure according to a second embodiment of the present disclosure can be derived from the first exemplary semiconductor structure by employing a planar semiconductor material portion having a uniform thickness in lieu of at least one semiconductor fins in each of the device regions (100A, 100B, 100C). Specifically, a first planar semiconductor material portion is employed in lieu of at least one first semiconductor fin 21A (See FIG. 1) as a first semiconductor material portion, a second planar semiconductor material portion is employed in lieu of at least one second semiconductor fin 21B (See FIG. 1) as a second semiconductor material portion, and a third planar semiconductor material portion is employed in lieu of at least one third semiconductor fin 21C (See FIG. 1) as a third semiconductor material portion.

Subsequently, a shallow trench isolation structure 14 laterally surrounding each of the first, second, and third planar semiconductor material portions can be formed by method known in the art. The processing steps of FIGS. 2 and 2A can be performed to form various disposable gate structures (70A, 72A, 70B, 72B, 70C, 72C) and various gate spacers (80A, 80B, 80C). Various source regions (92A', 92B', 92C') and various drain regions (93A', 93B', 93C') are formed in the planar semiconductor material portions.

The processing steps of FIGS. 3-6, 7 and 7A, 8-13, 14, 14A, 14B, and 14C are sequentially performed to provide the second exemplary structure illustrated in FIGS. 15, 15A, 15B, and 15C.

A first field effect transistor is formed in the first device region 100A, a second field effect transistor is formed in the second device region 100B, and a third field effect transistor is formed in the third device region 100C. The first channel layer 23A' and the first body portion 22A' collectively constitute the body region of the first field effect transistor, which is herein referred to as the first body region. The second channel layer 23B' and the second body portion 22B' collectively constitute a body region of the second field effect transistor, which is herein referred to as a second body region (22B', 23B'). The third body portion 22C' is the body region of the third field effect transistor.

The first body region (22A', 23A') of the first field effect transistor includes the first body portion 22A' containing the first semiconductor material and the first channel layer 23A' containing the second semiconductor material. The second semiconductor material of the first channel layer 23A' is epitaxially aligned to the first semiconductor material of the first body portion 22A', and contacts the first gate dielectric 40A and inner sidewalls of the first gate spacer 80A that laterally surrounds the first gate dielectric 40A.

The second body region (22B', 23B') of the second field effect transistor includes the second body portion 22B' containing the second semiconductor material and the second channel layer 23B' containing the second semiconductor material. The second semiconductor material of the second channel layer 23B' is epitaxially aligned to the second semiconductor material of the second body portion 22B', and contacts the second gate dielectric 40B and inner sidewalls of the second gate spacer 80B that laterally surrounds the second gate dielectric 40B.

The body region of the third field effect transistor is the third body portion 22C', which includes a portion of the first second semiconductor material in contact with the third gate dielectric 40C. In one embodiment, all inner sidewalls of the third gate spacer 80C can be in physical contact with surfaces of the third gate dielectric 80C.

The first channel region 23A' includes a sub-portion 23A'U having a uniform thickness. The second channel region 23B' includes a sub-portion 23B'U having a uniform thickness.

In one embodiment, sidewalls of the first channel region 23A' can be vertically coincident with inner sidewalls of the first gate spacer 80A, and sidewalls of the second channel region 23B' can be vertically coincident with inner sidewalls of the second gate spacer 80B.

The first body portion 22A' is a portion of a contiguous semiconductor material portion (92A', 93A', 22A') that includes a first source region 92A' and a first drain region 93A' and includes the first semiconductor material. The second body portion 22B' is a portion of a contiguous semiconductor material portion (92B', 93B', 22B') that includes a second source region 92B' and a second drain region 93B' and includes the first semiconductor material. Each contiguous semiconductor material portion can be a planar semiconductor material portion. The first body portion 22A' and the first channel region 23A' can have the same width as the first source region 92A' and the first drain region 93A'. The second body portion 22B' and the second channel region 23B' can have the same width as the second source region 92A' and the second drain region 93A'.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure comprising:
    providing a first semiconductor material portion and a second semiconductor material portion that include a first semiconductor material on a substrate;
    forming a first disposable gate structure straddling said first semiconductor material portion and a second disposable gate structure straddling said second semiconductor material;
    forming a planarization dielectric layer laterally surrounding said first disposable gate structure and said second disposable gate structure;
    removing said first disposable gate structure to form a gate cavity while said second disposable gate structure is not removed, wherein a region of said first semiconductor material portion is physically exposed within said gate cavity;
    forming an epitaxial semiconductor material portion comprising a second semiconductor material directly on a surface of said first semiconductor material within said gate cavity;
    removing said second disposable gate structure; and
    forming gate structures on said epitaxial semiconductor material portion and said second semiconductor material portion.

2. The method of claim 1, further comprising recessing said first semiconductor material portion within said gate cavity, wherein said surface of said first semiconductor material within said gate cavity is a recessed surface of said first semiconductor material portion.

3. The method of claim 2, wherein said first semiconductor material portion is a semiconductor fin, and sidewalls of said semiconductor fin are laterally recessed and a top surface of said semiconductor fin is vertically recessed during said recessing said first semiconductor material portion.

4. The method of claim 1, further comprising forming a source region and a drain region within said first semiconductor material portion, wherein a portion of said source region and a portion of said drain region are etched during said recessing of said first semiconductor material portion.

5. The method of claim 1, wherein said epitaxial semiconductor material portion is formed by selective epitaxy of said second semiconductor material.

6. The method of claim 1, further comprising forming a first gate spacer around said first disposable gate structure, wherein said epitaxial semiconductor material portion contacts inner surfaces of said first gate spacer.

7. The method of claim 1, wherein said second semiconductor material has a different band gap width than said first semiconductor material.

8. The method of claim 1, further comprising:
   forming a dielectric mask layer over said planarization dielectric layer; and
   patterning said dielectric mask layer to form an opening over said first disposable gate structure while masking said second disposable gate structure, wherein said first disposable gate structure is removed from underneath said opening in said dielectric mask layer.

9. The method of claim 1, further comprising:
   filling said gate cavity with a disposable oxide liner and a fill material portion while said second disposable gate structure is present over said substrate; and
   removing said fill material portion and said disposable oxide liner concurrently with removal of said second disposable gate structure.

10. The method of claim 9, further comprising replacing an upper portion of said fill material portion with a dielectric material portion prior to removal of said second disposable gate structure.

11. A semiconductor structure comprising a first field effect transistor and a second field effect transistor that are located on a substrate, wherein a first body region of said first field effect transistor comprises:
   a body portion including a first semiconductor material;
   a channel layer including a second semiconductor material epitaxially aligned to said first semiconductor material and contacting a first gate dielectric and inner sidewalls of a gate spacer that laterally surrounds said first gate dielectric, and wherein a second body region of said second field effect transistor comprises a portion of said second semiconductor material in contact with a second gate dielectric: and
   an insulator layer located in said substrate and contacting said first gate dielectric and said second gate dielectric, wherein an interface between said first gate dielectric and said insulator layer is vertically recessed relative to an interface between said second gate dielectric and said insulator layer.

12. The semiconductor structure of claim 11, wherein said channel layer includes a sub-portion having a uniform thickness.

13. The semiconductor structure of claim 11, wherein all inner sidewalls of another gate spacer is in physical contact with surfaces of said second gate dielectric.

14. The semiconductor structure of claim 11, wherein said second semiconductor material has a different band gap width than said first semiconductor material.

15. The semiconductor structure of claim 11, wherein sidewalls of said channel layer are vertically coincident with inner sidewalls of said gate spacer.

16. The semiconductor structure of claim 11, wherein said body portion of said first field effect transistor is a portion of a contiguous semiconductor material portion that comprises a source region and a drain region and includes said first semiconductor material.

17. The semiconductor structure of claim 16, wherein said contiguous semiconductor material portion is a semiconductor fin, and said body portion has a lesser width than said source region and said drain region.

18. The semiconductor structure of claim 17, wherein a difference between a width of said source region and said drain region and a width of said body portion is twice a difference between a height of said source region and said drain region and a height of said body portion.

19. The semiconductor structure of claim 16, further comprising a shallow trench isolation structure laterally surrounding said contiguous semiconductor material portion, wherein said source region and said drain region have a same width as said channel layer.

20. A semiconductor structure comprising a first field effect transistor and a second field effect transistor that are located on a substrate, wherein a first body region of said first field effect transistor comprises: a body portion including a first semiconductor material; and a channel layer including a second semiconductor material epitaxially aligned to said first semiconductor material and contacting a first gate dielectric and inner sidewalls of a gate spacer that laterally surrounds said first gate dielectric, and wherein a second body region of said second field effect transistor comprises a portion of said first second semiconductor material in contact with a second gate dielectric, said body portion of said first field effect transistor is a portion of a contiguous semiconductor material portion that comprises a source region and a drain region and includes said first semiconductor material, and said contiguous semiconductor material portion is a semiconductor fin, and said body portion has a lesser width than said source region and said drain region.

* * * * *